US012652768B2

(12) United States Patent (10) Patent No.: US 12,652,768 B2
Kim et al. (45) Date of Patent: Jun. 9, 2026

(54) ELECTRONIC DEVICE INCLUDING SLIDING DEVICE

(71) Applicant: SAMSUNG ELECTRONICS CO., LTD., Suwon-si (KR)

(72) Inventors: Seongjin Kim, Suwon-si (KR); Minseok Park, Suwon-si (KR); Gabseong Lee, Suwon-si (KR); Hyungsok Yeo, Suwon-si (KR); Igor Ivanov, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 98 days.

(21) Appl. No.: 18/815,994

(22) Filed: Aug. 27, 2024

(65) Prior Publication Data

US 2024/0422924 A1 Dec. 19, 2024

Related U.S. Application Data

(63) Continuation of application No. PCT/KR2023/002723, filed on Feb. 27, 2023.

(30) Foreign Application Priority Data

| | | |
|---|---|---|
| Feb. 28, 2022 | (KR) | 10-2022-0026163 |
| May 17, 2022 | (KR) | 10-2022-0060240 |

(51) Int. Cl.
*H05K 5/02* (2006.01)
(52) U.S. Cl.
CPC ................................. *H05K 5/0217* (2013.01)

(58) Field of Classification Search
None
See application file for complete search history.

(56) References Cited

U.S. PATENT DOCUMENTS

| | | | | |
|---|---|---|---|---|
| 11,029,733 B2 * | 6/2021 | Lee | ........................ | G06F 1/1626 |
| 11,199,876 B2 * | 12/2021 | Lee | ..................... | H04M 1/0237 |
| 11,526,198 B1 * | 12/2022 | Kanas | ................... | G06F 1/1624 |

(Continued)

FOREIGN PATENT DOCUMENTS

| | | |
|---|---|---|
| CN | 101278488 A | 10/2008 |
| CN | 113301197 A | 8/2021 |

(Continued)

OTHER PUBLICATIONS

European Search Report for European Patent Application No. 23760431.9 dated Apr. 7, 2025.

*Primary Examiner* — James Wu
*Assistant Examiner* — Christopher L Augustin
(74) *Attorney, Agent, or Firm* — CANTOR COLBURN LLP

(57) ABSTRACT

An electronic device includes a display area having a variable size by sliding of a slidable housing, and a sliding assembly which is connected to the housing. The sliding assembly includes sliding guides slidable relative to each other and together with each other, each sliding guide including an elastic member which provides an elastic force to the sliding guide along a sliding direction of the housing. At least one of the sliding guides is connected to a first housing and at least one of the sliding guides is connected to a second housing slidable relative to the first housing.

20 Claims, 20 Drawing Sheets

(56)     References Cited

U.S. PATENT DOCUMENTS

| | | | |
|---|---|---|---|
| 11,647,598 B2 * | 5/2023 | Zhang | G06F 1/1652 |
| | | | 361/807 |
| 12,167,552 B2 | 12/2024 | Feng | |
| 12,341,918 B2 * | 6/2025 | Hou | G09F 9/301 |
| 2008/0254844 A1 * | 10/2008 | Lee | H04M 1/0237 |
| | | | 455/575.4 |
| 2010/0128422 A1 * | 5/2010 | Zhou | H04M 1/0237 |
| | | | 361/679.01 |
| 2012/0309471 A1 | 12/2012 | Luo | |
| 2018/0014417 A1 | 1/2018 | Seo et al. | |
| 2018/0103550 A1 * | 4/2018 | Seo | G06F 1/1601 |
| 2020/0267247 A1 | 8/2020 | Song et al. | |
| 2021/0195009 A1 | 6/2021 | Choi et al. | |
| 2022/0361347 A1 | 11/2022 | Feng | |
| 2023/0124270 A1 | 4/2023 | Ko et al. | |

FOREIGN PATENT DOCUMENTS

| | | | |
|---|---|---|---|
| CN | 113938544 | A | 1/2022 |
| JP | 2009-253968 | A | 10/2009 |
| KR | 20070113863 | A | 11/2007 |
| KR | 10-0828212 | B1 | 5/2008 |
| KR | 20090021761 | A | 3/2009 |
| KR | 20100094327 | A | 8/2010 |
| KR | 20150120541 | A | 10/2015 |
| KR | 20180006533 | A | 1/2018 |
| KR | 20200099455 | A | 8/2020 |
| KR | 20210031348 | A | 3/2021 |
| WO | 2021238107 | A1 | 12/2021 |

* cited by examiner

ELECTRONIC DEVICE INCLUDING SLIDING DEVICE

CROSS-REFERENCE TO RELATED APPLICATIONS

This application is a continuation application of International Application No. PCT/KR2023/002723 designating the United States, filed on Feb. 27, 2023, in the Korean Intellectual Property Receiving Office and claiming priority to Korean Patent Application No. 10-2022-0026163, filed on Feb. 28, 2022, and Korean Patent Application No. 10-2022-0060240, filed on May 17, 2022, in the Korean Intellectual Property Office, the disclosures of which are incorporated by reference herein in their entireties.

BACKGROUND

(1) Field

Embodiments of the disclosure relate to an electronic device including a sliding device.

(2) Description of the Related Art

A rollable electronic device may include a flexible display in which an externally visible display area is capable of increasing or decreasing depending on the state of the electronic device. In the rollable electronic device, it is necessary to generate sliding movement by deforming the flexible display to cause the sliding movement. Therefore, a high load is required in the driving direction (e.g., the direction in which the portion of the electronic device where the display is disposed slides).

Conventional rollable electronic devices use a link method to generate a load in the driving direction. The link method is a method of mounting a spring in a direction perpendicular to the driving direction and generating force in the driving direction using a link structure.

SUMMARY

In a rollable electronic device using the conventional link method, force loss may occur because the direction in which the spring is compressed and tensioned is different from the direction in which the electronic device is driven (e.g., the direction in which the portion of the electronic device where the display is disposed slides) are different.

The conventional electronic device has limitations in implementing strokes in the driving direction above a certain level due to the link structure.

The conventional electronic device uses the spring up to its design limit, which may cause permanent deformation in the spring.

An embodiment of the disclosure may provide an electronic device including a sliding device and configured to prevent loss of force, implement a high stroke, and reduce permanent deformation of a spring.

An electronic device according to an embodiment of the disclosure includes a first housing, a second housing coupled to the first housing to be slidable in a first direction away from the first housing and a second direction opposite to the first direction, a display at least partially fixed to the second housing and having an externally visible area which increases or decreases depending on sliding of the second housing, and a sliding device connected to the first housing at one end and the second housing at the other end, and configured to cause the second housing to move elastically.

The sliding device according to an embodiment of the disclosure includes a first plate having one end located in the first housing and another end located in the second housing, and including a plurality of first grooves extending in a width direction of the electronic device and arranged at intervals in a length direction perpendicular to the width direction, a second plate disposed at a distance from the first plate in a height direction of the electronic device and including a plurality of second grooves extending to face the first grooves, a plurality of guides at least partially disposed in the first grooves and the second grooves between the first plate and the second plate; and one or more elastic members disposed on the guides. At least one of the plurality of guides may be connected to the first housing, and at least one of the plurality of guides may be connected to the second housing.

In the electronic device according to an embodiment of the disclosure, loss of force can be prevented by including the sliding device in which the direction in which elastic members (e.g., springs) are compressed or tensioned is the same as the driving direction.

In the electronic device including the sliding device according to an embodiment of the disclosure, a high stroke can be implemented by arranging the elastic members in a parallel stacking manner.

Since the electronic device including the sliding device according to an embodiment of the disclosure uses a parallel stacked arrangement structure, it may be possible to dispose the sliding device even in a structure with a relatively narrow width.

In the electronic device including the sliding device according to an embodiment of the disclosure, permanent deformation of the springs can be reduced.

BRIEF DESCRIPTION OF THE DRAWINGS

The above and other advantages and features of this disclosure will become more apparent by describing in further detail embodiments thereof with reference to the accompanying drawings, in which:

FIGS. 4A, 4B and 4C are views illustrating a sliding device according to an embodiment of the disclosure.

DETAILED DESCRIPTION

Figure 1:
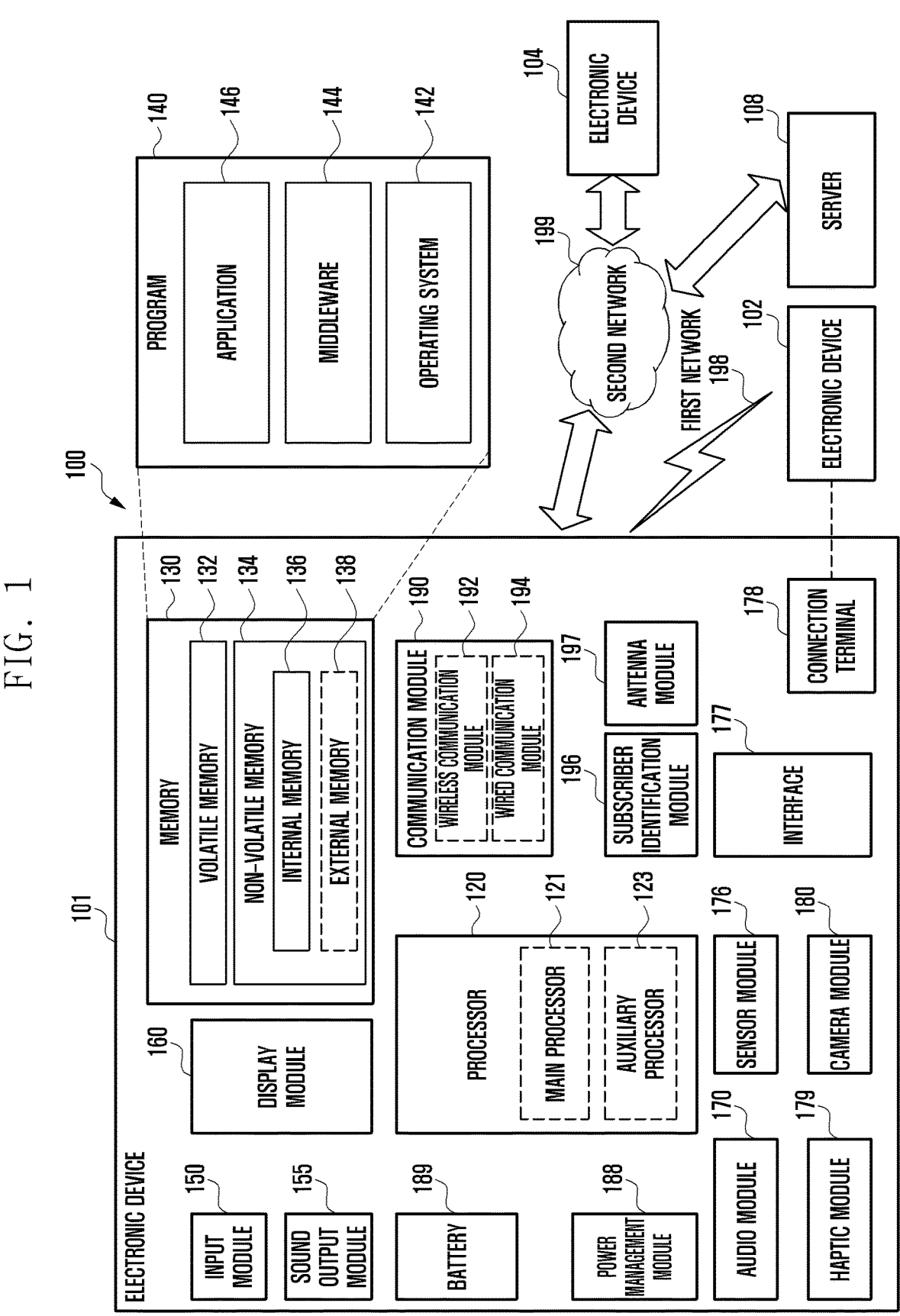
FIG. 1 is a block diagram of an electronic device according to an embodiment in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
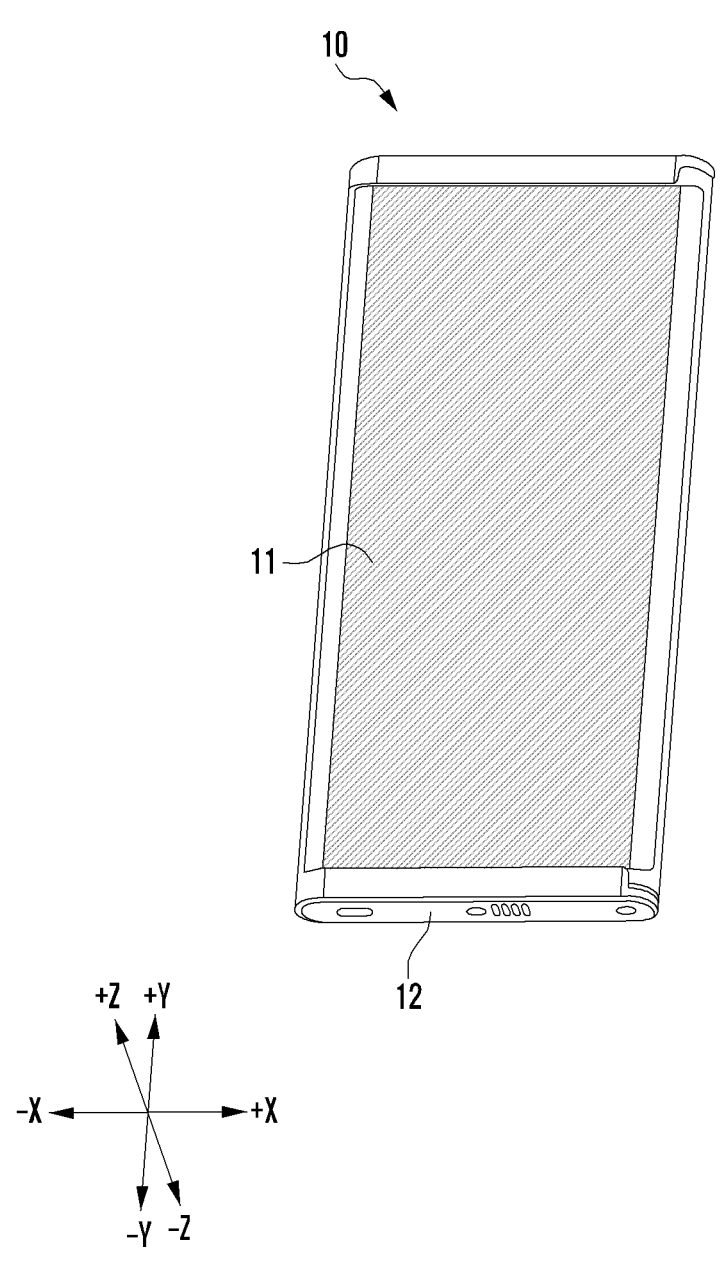
FIGS. 2A and 2B are perspective views illustrating an electronic device according to an embodiment of the disclosure.

FIG. 2A is a perspective view illustrating an electronic device 10 according to an embodiment of the disclosure. The electronic device 10 in FIG. 2A includes a display area of a display 11 which has a planar area along an x-y plane. The display area in FIG. 2A may have a minimum planar area for the electronic device 10 which is completely closed or fully retracted.

Figure 2B:
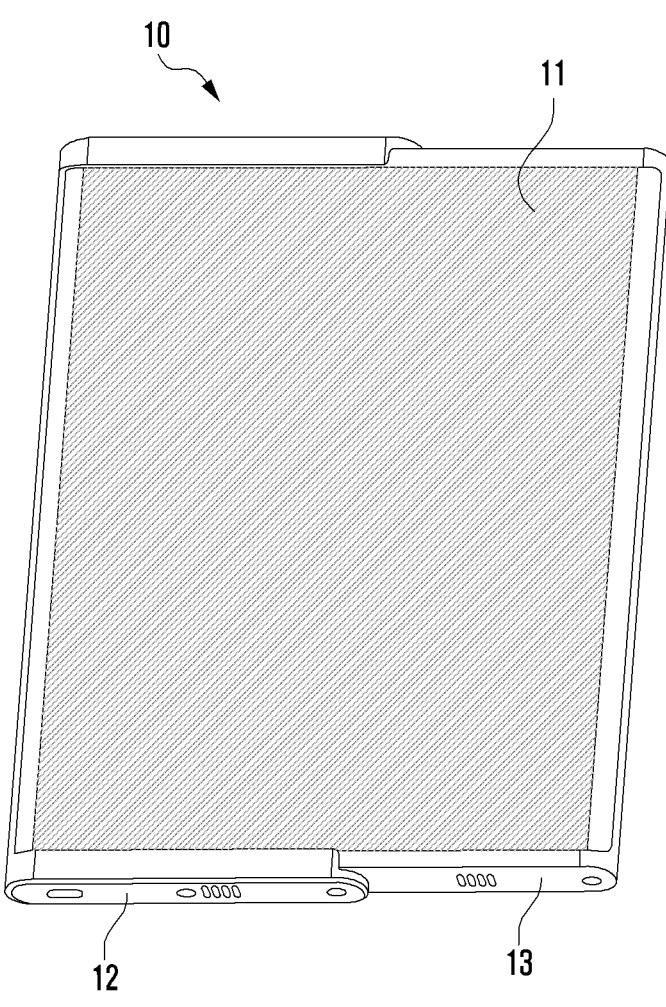
Figure 2B:
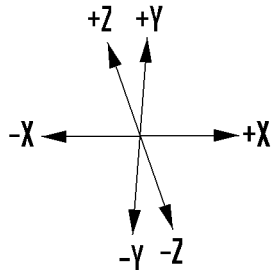

FIG. 2B is a view illustrating an increased display area of the display 11 of the electronic device 10 according to an embodiment of the disclosure. The electronic device 10 in FIG. 2B includes a display area having a planar area along the x-y plane which is greater than the planar area shown in FIG. 2A. The display area in FIG. 2B may have a maximum planar area for the electronic device 10 which is completely opened or fully expanded.

In describing the electronic device 10 according to an embodiment of the disclosure, the width direction of the electronic device 10 may refer to the x-axis direction (e.g., the +x-axis direction or the −x-axis direction), and the length direction of the electronic device 10 may refer to the y-axis direction (e.g., the +y-axis direction or the −y-axis direction). The height direction of the electronic device 10 may refer to the z-axis direction (e.g., the +z-axis direction or the −z-axis direction). A thickness of the electronic device 10 and various components or layers thereof may be defined along the z-axis direction, e.g., a thickness direction.

The electronic device 10 according to an embodiment of the disclosure may include a display 11, a first housing 12, and/or a second housing 13.

In an embodiment, the display 11 may be located on one surface (e.g., the surfaces oriented in the +z-axis direction)

of the first housing 12 and the second housing 13. That is, the display 11 may be on the first housing 12 and the second housing 13, located in the +z-axis direction along the thickness direction relative to the two housings. At least a portion of the display 11 may be fixed to the second housing 13. The display 11 may be moveable together with the second housing 13.

In an embodiment, a first direction may refer to the direction in which the second housing 13 moves away from the first housing 12 in the +x-axis direction, and a second direction may refer to the direction in which the second housing 13 moves toward the first housing 12 in the −x-axis direction. Here, the first and second directions may be defined along a sliding direction.

Referring to FIGS. 2A and 2B, the second housing 13 may be slidably coupled to the first housing 12. For example, the second housing 13 may be slid in the first direction away from the first housing 12 or may be slid in the second direction toward the first housing 12. That is, the second housing 13 may be slidable relative to the first housing 12, along the sliding direction.

In an embodiment, the externally visible area (e.g., visible planar area or visible display area) of the display 11 may be increased or decreased depending on the sliding of the second housing 13 of the electronic device 10. For example, when the second housing 13 is slid in the first direction, the externally visible area of the display 11 may be increased, and when the second housing 13 is slid in the second direction, the externally visible area of the display 11 may be decreased.

In an embodiment, the display 11 may be a flexible display at least a portion of which is bendable (e.g., can be bent). When the second housing 13 of the electronic device 10 is slid, at least a portion of the display 11 can be bent. That is, the display 11 may be bent together with sliding of the second housing 13 relative to the first housing 12.

Figure 3A:
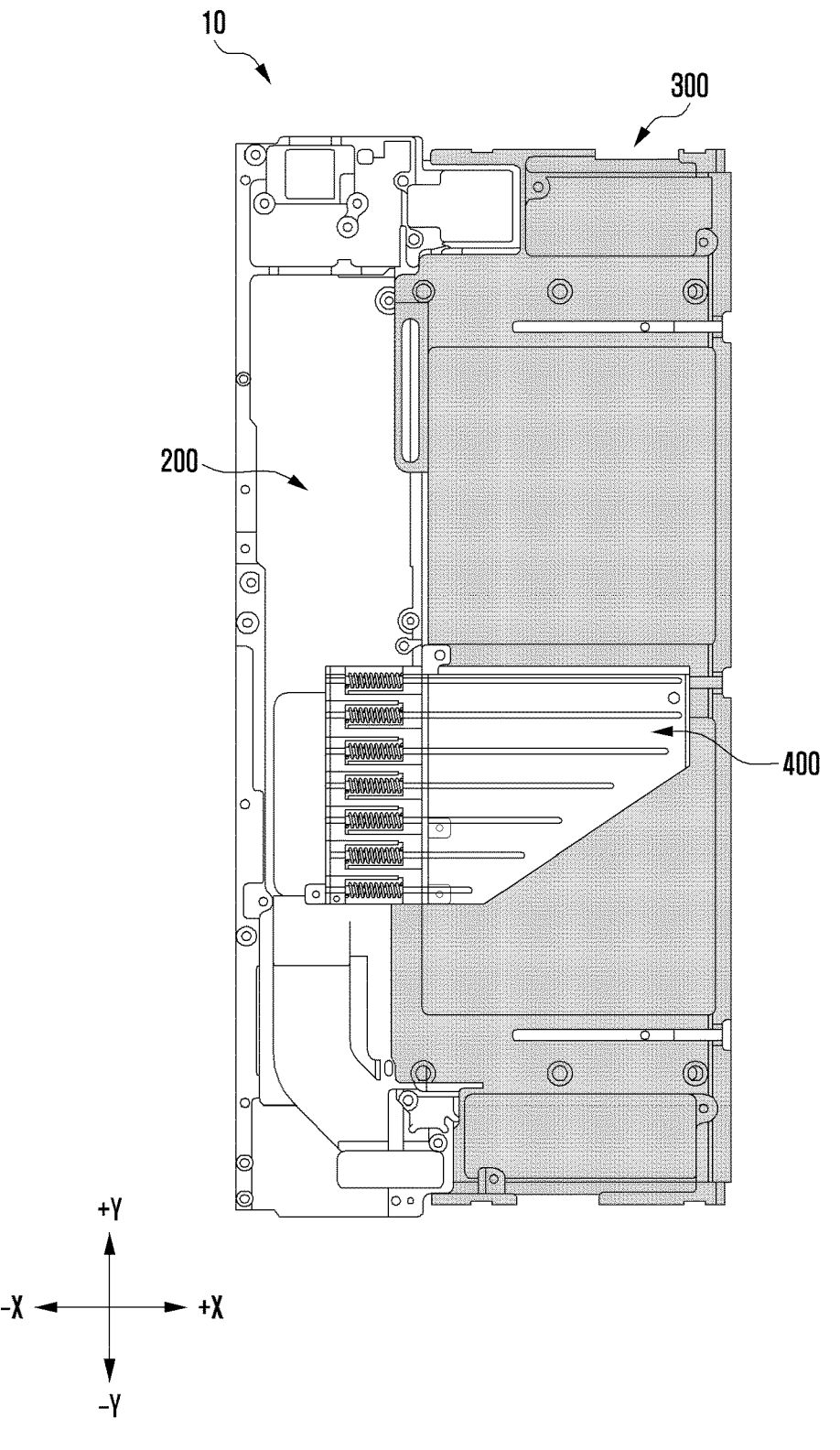
FIGS. 3A, 3B and 3C are views illustrating an electronic device including a sliding device according to an embodiment of the disclosure.

FIG. 3A is a plan view (e.g., view of the x-y plane) illustrating an electronic device 10 including a sliding device 400 according to an embodiment of the disclosure. FIG. 3A may illustrate the electronic device 10 which is completely closed or fully retracted, without being limited thereto.

Figure 3B:
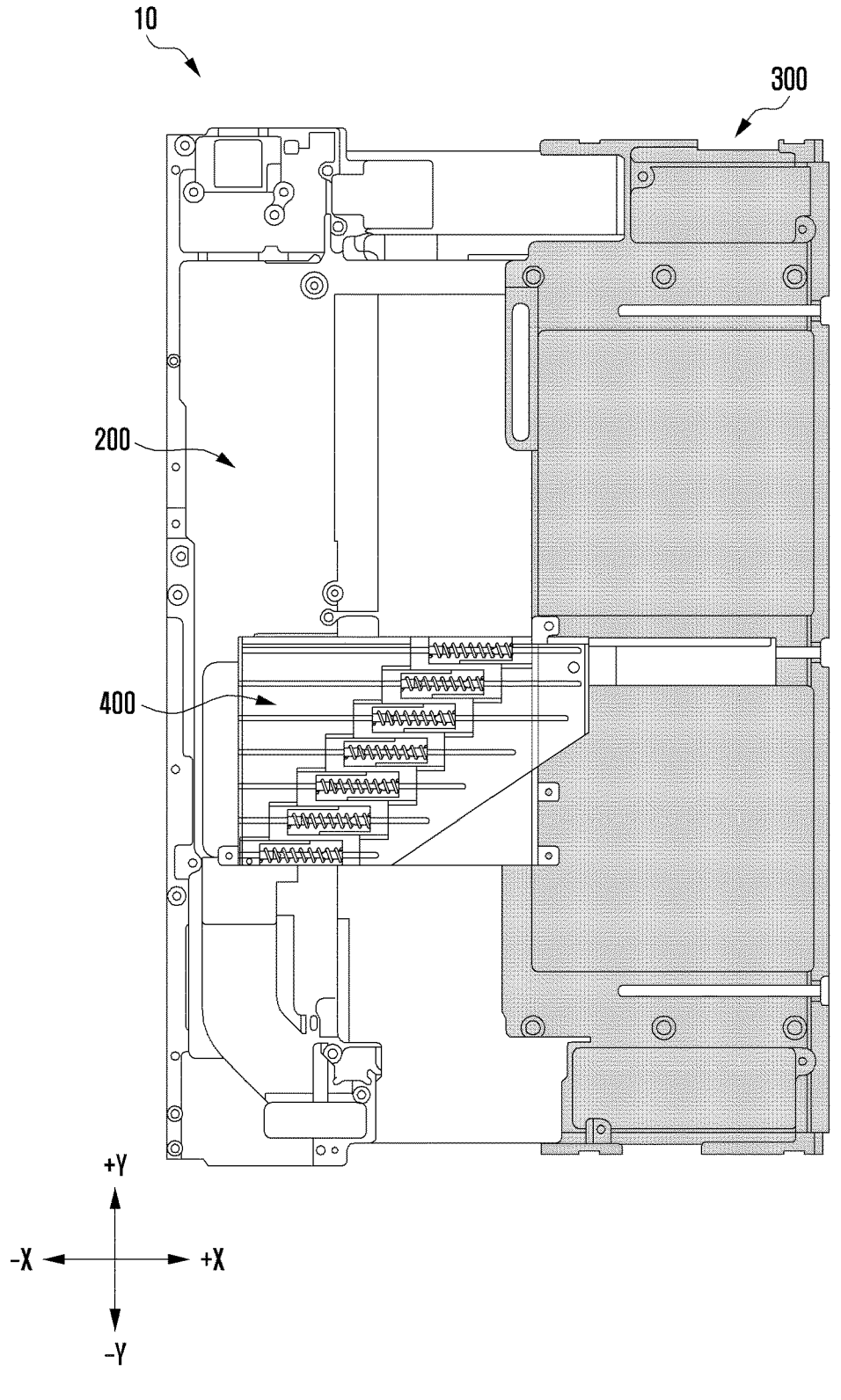

FIG. 3B is a plan view illustrating the state in which the sliding device 400 according to an embodiment of the disclosure is slid in the electronic device 10 in the first direction. FIG. 3B may illustrate the electronic device 10 which is completely (or partially) opened or fully (or partially) expanded, without being limited thereto.

Figure 3C:
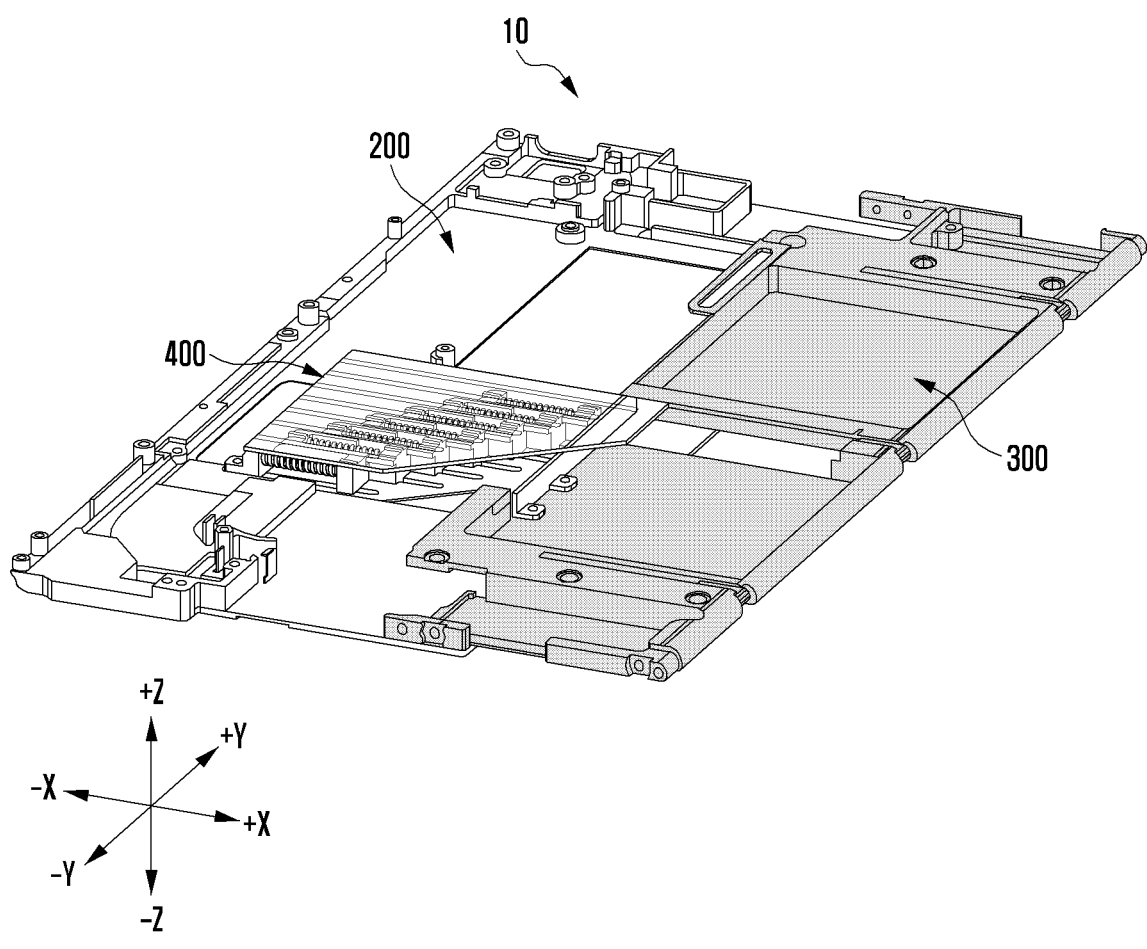

FIG. 3C is a perspective view illustrating the electronic device 10 including the sliding device 400 according to an embodiment of the disclosure. FIG. 3C may illustrate the electronic device 10 shown in FIG. 3B.

In describing the electronic device 10 according to an embodiment of the disclosure, the width direction of the electronic device 10 may refer to the x-axis direction (e.g., the +x-axis direction or the −x-axis direction), and the length direction of the electronic device 10 may refer to the y-axis direction (e.g., the +y-axis direction or the −y-axis direction). The height direction of the electronic device 10 may refer to the z-axis direction (e.g., the +z-axis direction or the −z-axis direction).

The electronic device 10 according to an embodiment of the disclosure may include a first housing 200, a second housing 300, and/or a sliding device 400.

In describing the sliding device 400 as a sliding assembly according to an embodiment of the disclosure, the width direction of the sliding device 400 may refer to the x-axis direction (e.g., the +x-axis direction or the −x-axis direction), and the length direction of the sliding device 400 may refer to the y-axis direction (e.g., the +y-axis direction or the −y-axis direction). The height direction of the sliding device 400 may refer to the z-axis direction (e.g., the +2-axis direction or the −z-axis direction).

In an embodiment, the first housing 200 may refer to the first housing 12 illustrated in FIG. 2A, and the second housing 300 may refer to the second housing 13 illustrated in FIG. 2A.

In an embodiment, a first direction may refer to the direction in which the second housing 300 moves away from the first housing 200 in the +x-axis direction along the sliding direction, and a second direction may refer to the direction in which the second housing 300 moves toward the first housing 200 in the −x-axis direction along the sliding direction.

In an embodiment, the sliding device 400 may extend in the length and width directions of the electronic device 10. That is, the length and the width of the sliding device 400 may be variable, such as to be extendable and retractable along the respective length direction and the respective width direction. The length direction of the sliding device 400 may be parallel to the length direction of the electronic device 10, and the width direction of the sliding device 400 may be parallel to the width direction of the electronic device 10.

In an embodiment, one end (e.g., a first end) and the other end (e.g., a second end) of the sliding device 400 may refer to opposite ends of the sliding device 400 based on the width direction of the sliding device 400 (e.g., the x-axis direction). For example, the one end of the sliding device 400 refers to the distal end located in the −x-axis direction with reference to the middle position in the width direction of the sliding device 400 (e.g., the x-axis direction), and the other end of the sliding device 400 may refer to the distal end located in the +x-axis direction with reference to the middle position in the width direction of the sliding device 400 (e.g., the x-axis direction).

In an embodiment, the sliding device 400 may serve to interconnect the first housing 200 and the second housing 300 to each other. That is, the first housing 200 and the second housing 300 may be slidably coupled to each other by the sliding device 400 At least a portion of the first housing 200 may be connected to one end of the sliding device 400, and at least a portion of the second housing 300 may be connected to the other end of the sliding device 400. That is, the sliding device 400 is fixed to the first housing 200 at the first end of the sliding device 400 and to the second housing 300 at the second end of the sliding device 400. The sliding device 400 may allow the second housing 300 to elastically move in the first and second directions which are along the sliding direction.

Referring to FIGS. 3B and 3C, the second housing 300 may be slid in the first direction with respect to a position of the first housing 200. The sliding device 400 may include a configuration capable of elastically sliding in the first and second directions in at least a portion thereof. The second housing 300 may be elastically moved in the first and second directions relative to the first housing 200, by using the sliding device 400.

Figure 4A:
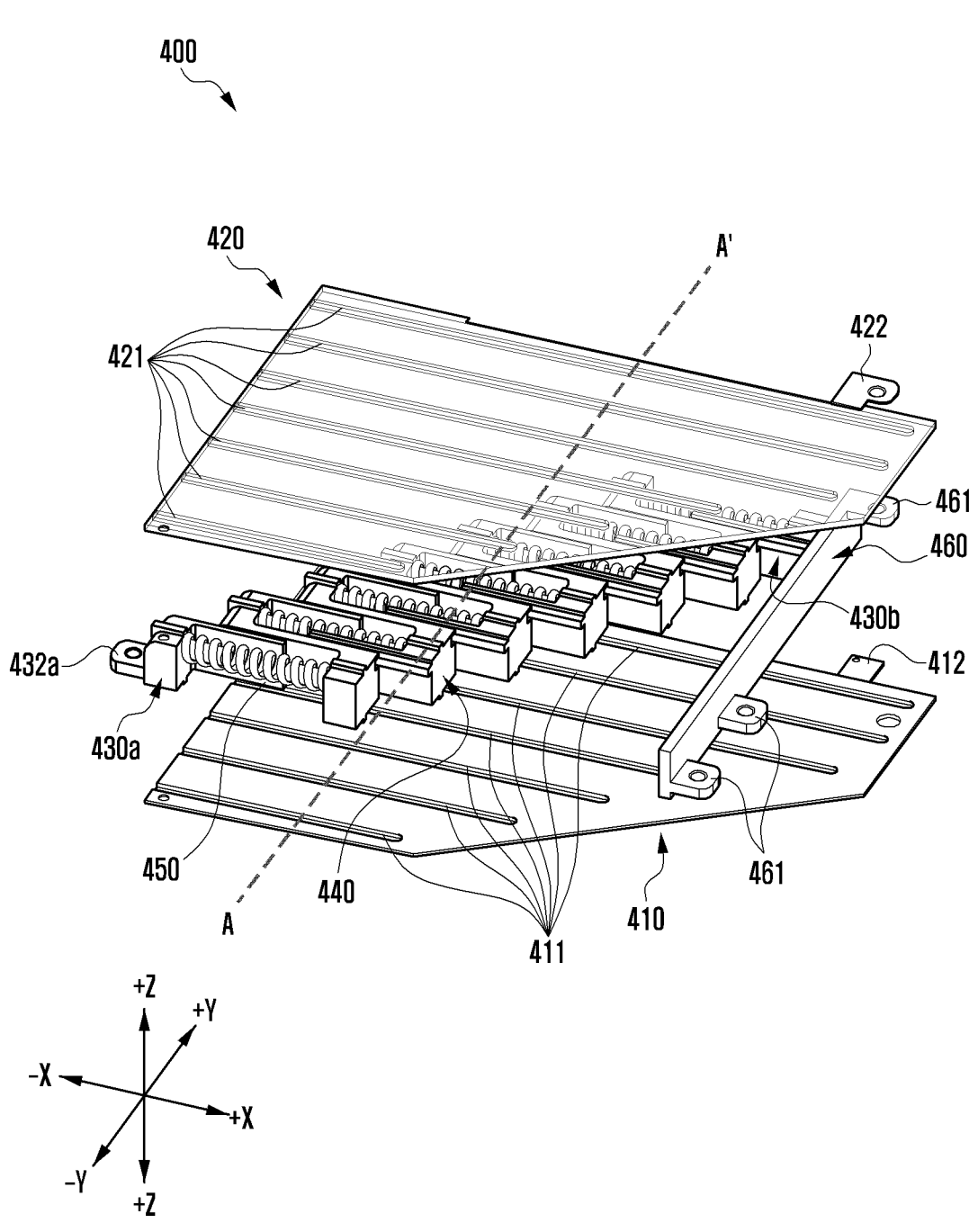

FIG. 4A is an exploded perspective view of the sliding device 400 according to an embodiment of the disclosure.

Figure 4B:
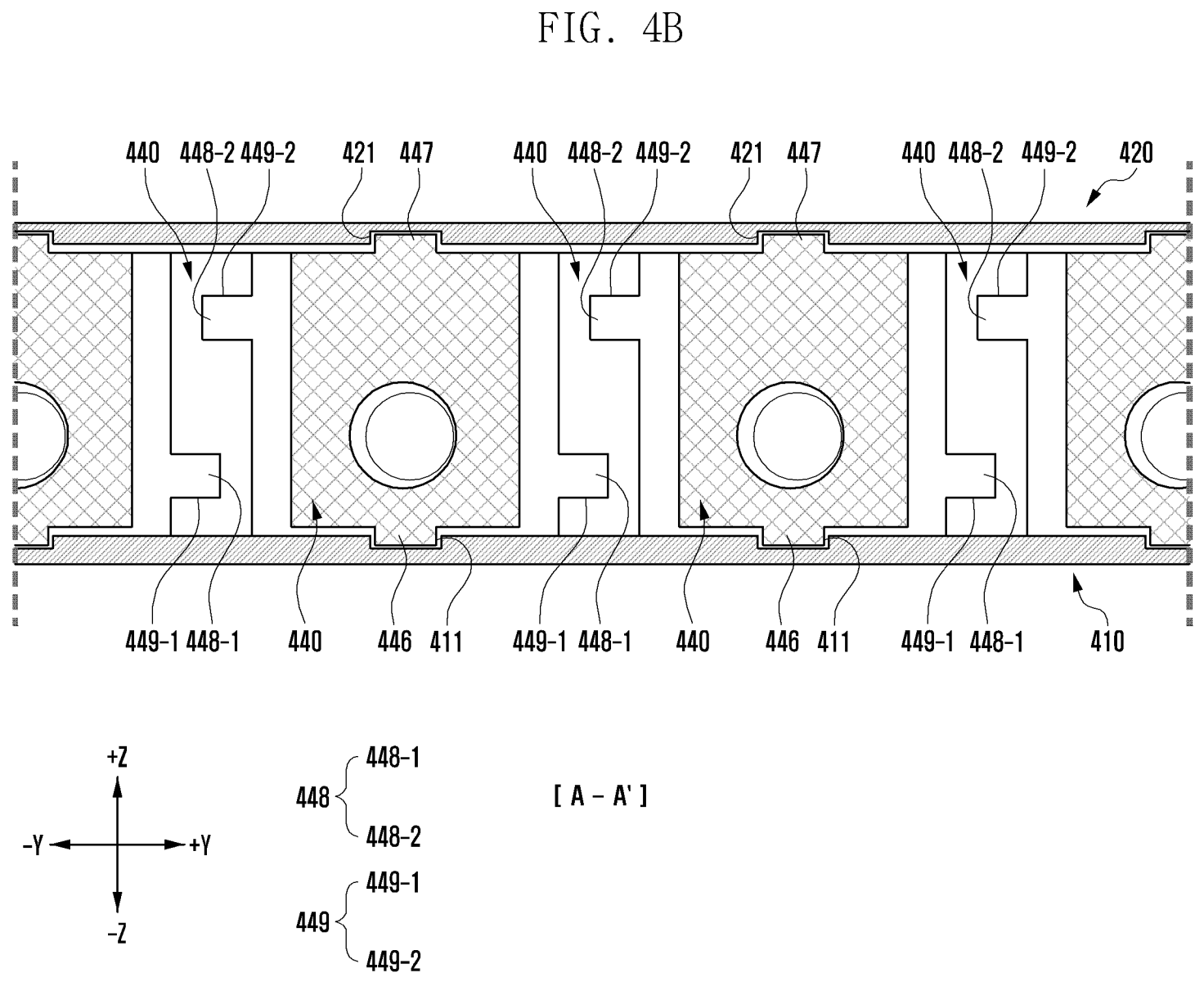

FIG. 4B is a cross-sectional view illustrating the sliding device 400 taken along line A-A' indicated in FIG. 4A.

Figure 4C:
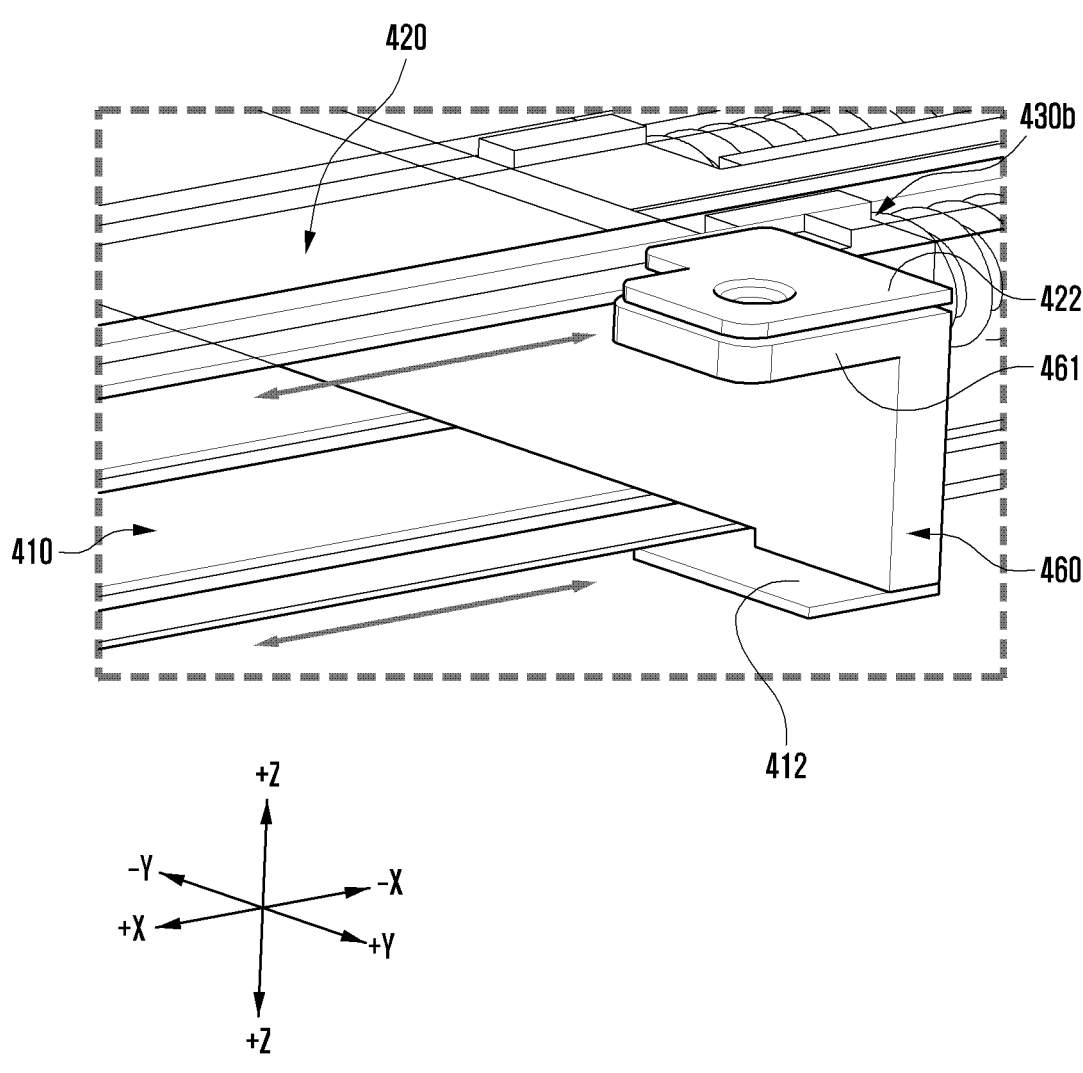

FIG. 4C is an enlarged perspective view illustrating a drive coupling member 460 and slide members 412 and 422 according to an embodiment of the disclosure.

In an embodiment, a first direction may refer to the direction in which the second housing 300 (see FIG. 3A) moves away from the first housing 200 (see FIG. 3A) in the +x-axis direction, and a second direction may refer to the direction in which the second housing 300 (see FIG. 3A) moves toward the first housing 200 (see FIG. 3A) in the −x-axis direction.

In an embodiment, the width direction of the electronic device 10 may refer to the x-axis direction (e.g., the +x-axis direction or the −x-axis direction), and the length direction of the electronic device 10 may refer to the y-axis direction (e.g., the +y-axis direction or the −y-axis direction). The height direction of the electronic device 10 may refer to the z-axis direction (e.g., the +z-axis direction or the −z-axis direction).

The sliding device 400 according to an embodiment of the disclosure may include a first plate 410, a second plate 420 facing the first plate 410, a first fixed guide 430a, a second fixed guide 430b, a connection guide 440, an elastic member 450, and/or a drive coupling member 460.

In an embodiment, the first plate 410 may have a plate shape extending in the length and width directions of the electronic device 10.

In an embodiment, the first plate 410 may include (or define) a first groove 411 and/or a first slide member 412. The first groove 411 may be recessed from an inner surface of the first plate 410.

In an embodiment, the first groove 411 may extend in the width direction of the electronic device 10 (e.g., the x-axis direction). The first plate 410 may include a plurality of first grooves 411. The plurality of first grooves 411 may be arranged at intervals in (or along) the length direction of the electronic device 10 (e.g., the y-axis direction). Each of the first grooves 411 may extend to have a major dimension along the sliding direction.

In an embodiment, the first slide member 412 may be disposed on at least a portion of the first plate 410. For example, the first slide member 412 may be disposed on a side surface of the first plate 410 (e.g., the side surface oriented in the +y-axis direction). The first slide member 412 may be a first protrusion of the first plate 410. The first slide member 412 may be coupled to at least a portion of the first plate 410 to be slidable relative to the first housing 200 in the first direction or the second direction.

In an embodiment, the first fixed guide 430a, the second fixed guide 430b, the connection guide 400, the clastic member 450, and/or the drive coupling member 460 may be disposed on one surface of the first plate 410. The one surface of the first plate 410 may refer to the surface of the first plate 410 oriented in the height direction of the electronic device 10 (e.g., the z-axis direction). That is, the first fixed guide 430a, the second fixed guide 430b, the connection guide 400, the clastic member 450, and/or the drive coupling member 460 may face the inner surface of the first plate 410.

In an embodiment, the one side of the first plate 410 (e.g., a first side) may refer to the side surface of the first plate 410 oriented in the −y-axis direction. The other side of the first plate 410 (e.g., the second side) may refer to the side surface of the first plate 410 oriented in the +y-axis direction in the first plate 410.

In an embodiment, the first fixed guide 430a may be disposed in the first groove 411 provided adjacent to the one side of the first plate 410. That is, the first fixed guide 430a may be disposed in the first groove 411 which is closest to the one side of the first plate 410. The first fixed guide 430a may be at least partially coupled to the first housing 200 (see FIG. 3A). That is, a portion of the first fixed guide 430*a* may be fixed to the first housing 200.

In an embodiment, the second fixed guide 430*b* may be disposed in the first groove 411 provided adjacent to the other side of the first plate 410. That is, the second fixed guide 430*b* may be disposed in the first groove 411 which is closest to the other side of the first plate 410. The second fixed guide 430*b* may be at least partially directly coupled and connected to the second housing 300 (see FIG. 3A), or may be coupled to the drive coupling member 460 to be connected to the second housing 300 via the drive coupling member 460 as an intervening member (see FIG. 3A).

In an embodiment, the connection guide 440 may be disposed between the first fixed guide 430*a* and the second fixed guide 430*b* along the one surface of the first plate 410, such as along the y-axis direction.

In an embodiment, the sliding device 400 may include a plurality of connection guides 440 each disposed between the first fixed guide 430*a* and the second fixed guide 430*b*. Positions of the plurality of connection guides 440 may be variable such that the connection guide 410 are stacked and arranged in the length and width directions of the electronic device 10.

In an embodiment, the drive coupling member 460 may be at least partially connected to the second fixed guide 430*b*. The drive coupling member 460 may extend in the length direction of the electronic device 10.

In an embodiment, the drive coupling member 460 may include a plurality of coupling areas 461 as coupling protrusions. The plurality of coupling areas 461 may be arranged at intervals in the length direction of the drive coupling member 460. The drive coupling member 460 may be coupled to the second housing 300 using separate fastening members (not illustrated) at the plurality of coupling areas 461, or may be coupled to the second housing 300 using welding at the plurality of coupling areas 461. Since the second housing 300 is slidable relative to the first housing 200, the drive coupling member 460 which is coupled to the second housing 300 may be movable together with the second housing 300 to be slidable relative to the first housing 200.

The separate fastening members (not illustrated) may include bolts and/or rivets. When the fastening members (not illustrated) are bolts, bolts with threads on the surfaces may be fixed to the coupling areas 461 of the drive coupling member 460 by a screw fastening method. When the fastening members (not illustrated) are rivets, rivets made of metal may be fixed to the coupling areas 461 of the drive coupling member 460. When welding as a direct bond is used for coupling, material of the coupling areas 461 of the drive coupling member 460 may be partially melted through the welding and coupled to the material of the second housing 300.

In an embodiment, the second plate 420 may be disposed at a distance from the first plate 440 in the height direction of the electronic device (e.g., the z-axis direction), such as to define a gap therebetween. The second plate 420 facing the first plate 410 may have a plate shape extending in the length and width directions of the electronic device 10.

In an embodiment, the second plate 420 may include a second groove 421 and/or a second slide member 422.

In an embodiment, the second groove 421 may extend in the width direction of the electronic device 10 (e.g., the x-axis direction). The second plate 420 may include a plurality of second grooves 421. The plurality of second grooves 421 may be arranged at intervals in the length direction of the electronic device 10.

In an embodiment, the second slide member 422 may be disposed on at least a portion of the second plate 420. The second slide member 422 as a protruded portion of the second plate 420 may be disposed, for example, on a side surface of the second plate 420 (e.g., the side surface oriented in the +y-axis direction). The second slide member 422 may be coupled to at least a portion of the second plate 420 to be slidable relative to the first housing 200 in the first direction or the second direction.

In an embodiment, the second grooves 421 may be provided at positions corresponding to the first grooves 411. Referring to FIG. 4B, a pair of grooves (e.g., a first groove 411 and a second groove 421) may face each other along the thickness direction. For example, the second grooves 421 may be arranged at positions displaced in the height direction of the electronic device 10 (e.g., z-axis direction) from the positions where the plurality of first grooves 411 are arranged. Each second groove 421 may be located at a distance from each first groove 411 only in the height direction of the electronic device 10 (e.g., the z-axis direction) and disposed at the same position as each first groove in the width direction of the electronic device 10 (e.g., the z-axis direction) and the length direction (e.g., the y-axis direction) of the electronic device 10. The length of each second groove 421 extending in the width direction of the electronic device 10 (e.g., x-axis direction) may be the same as the length of a corresponding one of the first groove 411, which is located at a distance from each second groove 421 in the height direction (e.g., z-axis direction) and extends in the width direction of the electronic device 10 (e.g., the x-axis direction).

In an embodiment, the guides 430*a*, 430*b*, and 440 may include a first fixed guide 430*a*, a second fixed guide 430*b*, and a connection guide 440.

In an embodiment, the guides 430*a*, 430*b*, and 440 may each include a first protrusion 446, a second protrusion 447, a connection protrusion 448, and/or a connection groove 449 in at least a portion. The guides 430*a*, 430*b*, and 440 may each be connected to or engaged with the first plate 410 and the second plate 420 using the first protrusion 446 and the second protrusion 447, respectively. For example, the first protrusion 446 and the second protrusion 447 may be disposed in the first groove 411 of the first plate 410 and the second groove 421 of the second plate 420, respectively. The first fixed guide 430*a*, the second fixed guide 430*b*, and a plurality of connection guides 440 may be connected to each other using connection protrusions 448 and connection grooves 449 respective engaged with each other, and may be capable of sliding in the first direction or the second direction. That is, the guides 430*a*, 430*b*, and 440 engaged with each other along the y-axis direction may be slidable relative to each other along the sliding direction (e.g., the x-axis direction), owing to the connection protrusions 448 and connection grooves 449 respective engaged with each other at a position between two adjacent guides.

In an embodiment, one surface (e.g., a lower surface) of each connection guides 440 may be the surface oriented in the −z-axis direction of the connection guide 440. The other surface of each connection guide 440 (e.g., an upper surface which opposes the lower surface) may be the surface of the connection guide 440 oriented in the +z-axis direction.

Referring to FIG. 4B, the first protrusion 446 may be provided on (or at) one surface of each connection guide 440, and the second protrusion 447 may be provided on (or at) the other surface. Each of the protrusions may protrude further than a main body of the respective guide to allow engagement with respective grooves in the facing plates (e.g., the first plate 410 and the second plate 420). In cross-section, the first protrusion 446 has a shape corresponding to a shape of each first groove 411 of the first plate 410 and may be disposed in the first groove 411 to be moveable along the first groove 411. The second protrusion 447 has a cross-sectional shape corresponding to a cross-sectional shape of each second groove 421 of the second plate 420 and may be disposed in the second groove 421 to be moveable along the second groove 412.

In an embodiment, one side (e.g., a first side surface) of each connection guide 440 may be the side surface oriented in the −y-axis direction in the connection guide 440. The other side (e.g., the second side surface) of each connection guide 440 may be the side surface of the connection guide 440 oriented in the +y-axis direction. The side surfaces may connect the upper and lower surfaces of the connection guide 440 to each other.

In an embodiment, the connection groove 449 may include a first connection groove 449-1 and a second connection groove 449-2. The first connection groove 449-1 may be provided on the one side of each connection guide 440 (e.g., the side surface of the connection guide 440 oriented in the −y-axis direction). The second connection groove 449-2 may be provided on the other side of each connection guide 440 (e.g., the side surface of the connection guide 440 oriented in the +y-axis direction). The connection grooves may be recesses within a body of the respective guide.

In an embodiment, the first connection groove 449-1 and the second connection groove 449-2 may be provided at different positions with reference to the height direction of the electronic device 10 (e.g., the z-axis direction). For example, the second connection groove 449-2 may be provided at a position displaced in the +y-axis direction and the +z-axis direction with reference to the first connection groove 449-1.

In an embodiment, the connection protrusion 448 may include a first connection protrusion 448-1 and a second connection protrusion 448-2. The first connection protrusion 448-1 may be disposed at the position where the first connection groove 449-1 is provided.

The second connection protrusion 448-2 may be disposed at the position where the second connection groove 449-2 is provided. In an embodiment, the various connection protrusions may be engaged with and slidable along (e.g., slidably engaged with) a respective connection groove.

In an embodiment, the first connection protrusion 448-1 and the second connection protrusion 448-2 may be provided at different positions with reference to the height direction of the electronic device 10 (e.g., the z-axis direction). For example, the second connection protrusion 448-2 may be provided at a position displaced in the +z-axis direction with reference to the first connection protrusion 448-1.

In an embodiment, in the first connection groove 449-1 and the second connection groove 449-2 of a connection guide 440 (e.g., a first connection guide), the connection protrusions 448 of other connection guides 440 (e.g., a second connection guide and a third connection guide on opposing sides of the first connection guide) located on one side and the other side of the connection guide 440, respectively, may be disposed. For example, in the first connection groove 449-1 of a connection guide 440 as the first connection guide, the first connection protrusion 448-1 of another connection guide 440 located on one side of the connection guide 440 as the second connection guide may be disposed. In the second connection groove 449-2 of the connection guide 440, the second connection protrusion 448-2 of still another connection guide 440 located on the other side of the connection guide 440 as the third connection guide may be disposed.

In an embodiment, a connection guide 440 may be connected to another connection guide 440 located adjacent thereto by connection or engagement of a connection protrusion 448 with a connection groove 449. The connection protrusion 448 of a connection guide 440 is slidably disposed in the connection groove 449 of another connection guide 440 and may be movable in the first or second direction relative to such another connection guide 440. Using the connection protrusion 448 slidably engaged with a respective connection groove, the connection guide 440 may be movable in the first or second direction in the state of being in contact with the another connection guide 440 which defines the respective connection groove.

Referring to FIG. 4B, it is illustrated that each connection guide 440 includes one connection protrusion 448 on each of one side and the other side thereof, but the arrangement of the connection protrusions 448 may not be limited thereto. For example, two connection protrusions 448 may be included on only one side of each connection guide 440 (e.g., the side surface oriented in the +y-axis), or two connection protrusions 448 may be respectively provided on each of one side and the other side of each connection guide 440. Connection grooves 448 in each connection guide 440 may be provided to correspond to the number and arrangement of connection protrusions 448 of another connection guide 440 which is adjacent to the each connection guide 440.

FIG. 4B illustrates connection guides 440 as an example, but each of the fixed guides 430a and 430b may also variously have a first protrusion (not illustrated), a second protrusion (not illustrated), a connection protrusion (not illustrated), and/or a connection groove (not illustrated). For example, a first protrusion (not illustrated) may be provided on one surface of each of the fixed guides 430a and 430b, and a second protrusion (not illustrated) may be provided on the other surface. A connection protrusion (not illustrated) and a connection groove (not illustrated) may be provided on one side of each of the fixed guides 430a and 430b (e.g., the side surface of each the fixed guides 430a and 430b which faces and is in contact with an adjacent connection guide 440).

Referring to FIG. 4C, the first slide member 412 and/or the second slide member 422 may be coupled to at least a portion of the drive coupling member 460. For example, the first slide member 412 may be disposed on one surface (e.g., the surface oriented in the +z-axis direction) at one end (e.g., the distal end oriented in the +y-axis direction) of the drive coupling member 460. The second slide member 412 may be disposed on the other surface (e.g., the surface oriented in the −z-axis direction) of the one end of the drive coupling member 460.

In an embodiment, the second fixed guide 430b may be disposed in the second direction (e.g., the −x-axis direction) with reference to the drive coupling member 460. The second fixed guide 430b may be moved in the first direction (e.g., the +x-axis direction) or the second direction, and the drive coupling member 460 may also be moved in the first direction or the second direction.

In an embodiment, since the first slide member 412 and the second slide member 422 are coupled to at least a portion of the drive coupling member 460, the first slide member 412 and the second slide member 422 may be moved in the first direction or the second direction simultaneously with the drive coupling member 460. That is, since the second housing 300 is slidable relative to the first housing 200, and since the drive coupling member 460 is coupled to the second housing 300, the first slide member 412 and the second slide member 422 which are coupled to the drive coupling member 460 may be movable together with the second housing 300 to be slidable relative to the first housing 200. Furthermore, since the first fixed guide 430a is fixedly coupled to the first housing 200 while the connection guides 440 and the second fixed guide 430b are interconnected with each other to be ultimately connected to the first fixed guide 430a, all of the connection guides 440, the second fixed guide 430b, the first slide member 412, the second slide member 422, the drive coupling member 460 and the second housing 430 may be movable together with each other relative to the first housing 200 for sliding operation of the electronic device 10.

Figure 5A:
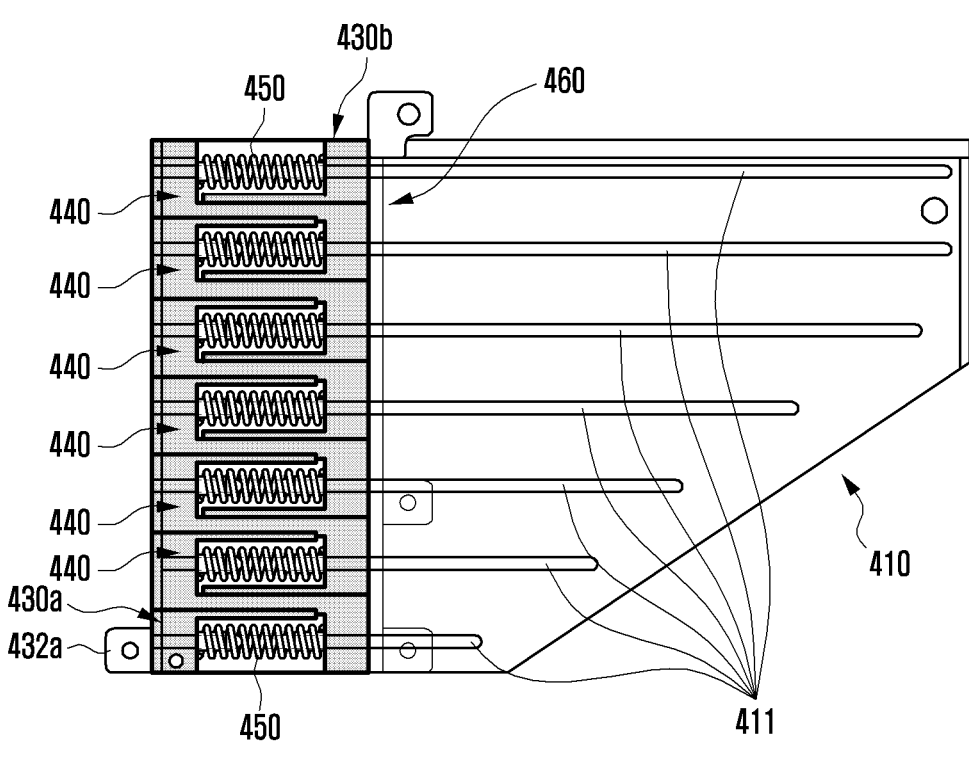
FIGS. 5A, 5B and 5C are views illustrating a sliding device according to an embodiment of the disclosure.
Figure 5A:
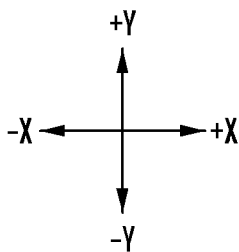

FIG. 5A is a view illustrating a first state of the sliding device 400 according to an embodiment of the disclosure. Here, the sliding device 400 may be considered completely closed or fully retracted such that the display area (refer to FIG. 2A) may have a minimum planar area for the electronic device 10 which is completely closed or fully retracted.

Figure 5B:
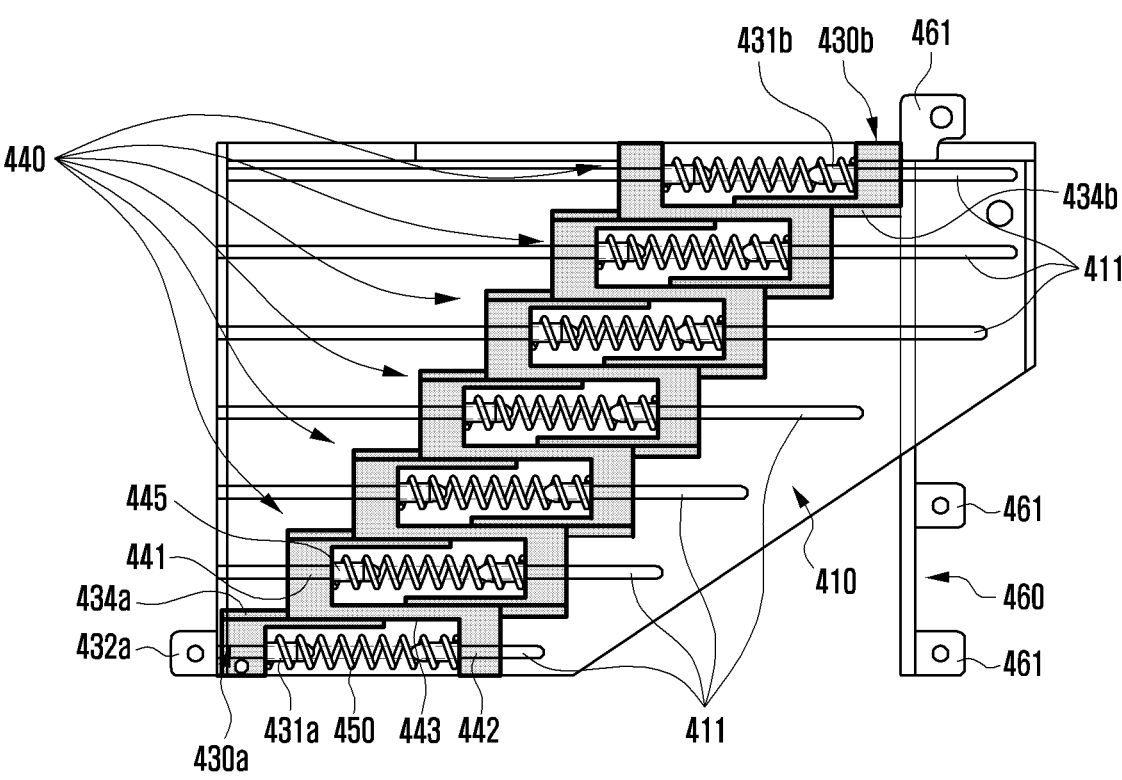
Figure 5B:
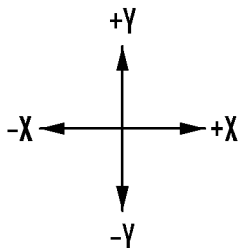

FIG. 5B is a view illustrating a second state of the sliding device 400 according to an embodiment of the disclosure. Here, the sliding device 400 may be considered completely opened or fully expanded (or partially open or expanded) such that the display area in FIG. 2B may have a planar area for the electronic device 10 which is maximum or somewhere between minimum and maximum.

Figure 5C:
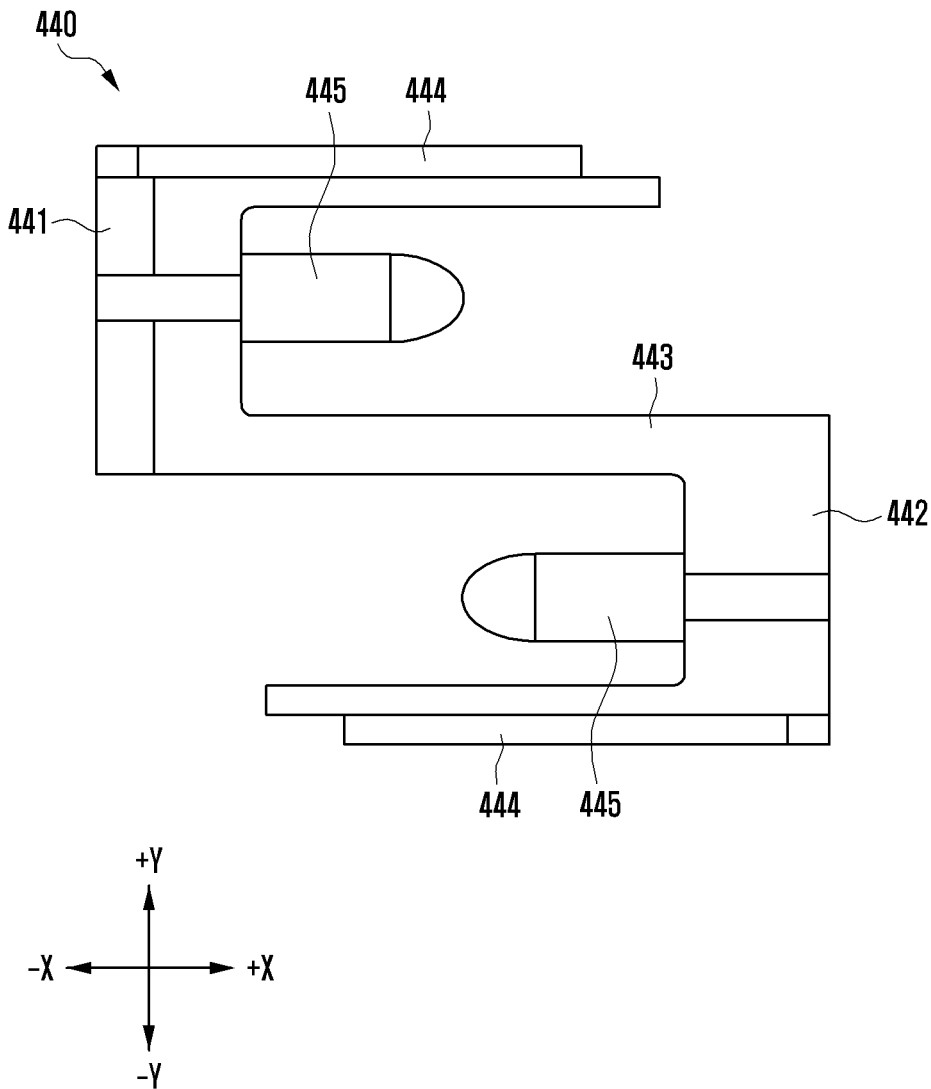

FIG. 5C is a plan view illustrating a connection guide 440 according to an embodiment of the disclosure.

In an embodiment, a first direction may refer to the direction in which the second housing 300 (see FIG. 3A) moves away from the first housing 200 (see FIG. 3A) in the +x-axis direction, and a second direction may refer to the direction in which the second housing 300 (see FIG. 3A) moves toward the first housing 200 (see FIG. 3A) in the −x-axis direction.

In an embodiment, the first state may refer to the state in which the second housing 300 (see FIG. 3A) is located closest to the first housing 200 (see FIG. 3A) along the first direction. The first state may refer to the state in which the second fixed guide 430b of the sliding device 400 is moved to be at a minimum distance from the first fixed guide 430a in the first direction.

In an embodiment, the second state may refer to the state in which the second housing 300 (see FIG. 3A) is located farthest from the first housing 200 (see FIG. 3A) in the first direction. The second state may refer to the state in which the second fixed guide 430b of the sliding device 400 is moved to be at a maximum distance from the first fixed guide 430a in the first direction.

In an embodiment, while the connection guides 440 and the second fixed guide 430b of the sliding device 400 are moved together with each other in the first direction and the second direction, the second housing 300 (see FIG. 3A) may be corresponding moved in the first direction and the second direction.

In an embodiment, the first fixed guide 430a may be disposed in the first groove 411 provided adjacent to one side (e.g., the side surface oriented in the −y-axis direction) of the first plate 410. The second fixed guide 430b may be disposed in the first groove 411 provided adjacent to the other side (e.g., the side surface oriented in the +y-axis direction) of the first plate 410. The first fixed guide 430a and the second fixed guide 430b may each be considered an outermost guide among all of the guides of the sliding device 400 (e.g., 430a, 430b and each 400).

In an embodiment, the position of the first fixed guide 430a may be fixed on the one surface of the first plate 410. For example, the first fixed guide 430a may be coupled to the first plate 410 and/or the second plate 420 (see FIG. 4A) using a separate fastening member (not illustrated) or welding to be fixed in position on the first plate 410, that is, a fixed position along the sliding direction. The separate fastening member (not illustrated) may include a bolt and/or a rivet. When the fastening member (not illustrated) is a bolt, a bolt with a thread on the surface may be fixed to the first fixed guide 430a by a screw fastening method. When the fastening member (not illustrated) is a rivet, a rivet made of metal may be fixed to the first fixed guide 430a. When welding is used for coupling, the first fixed guide 430a to be coupled may be partially melted through welding and coupled to the first plate 410 and/or the second plate 420 (see FIG. 4A).

A plurality of connection guides 440 according to an embodiment of the disclosure may be interconnected with each other and disposed between the first fixed guide 430a and the second fixed guide 430b. For example, with reference to the first direction, the first fixed guide 430a, the plurality of connection guides 440, and the second fixed guide 430b may be arranged in that order.

In the first state, the plurality of connection guides 440 may be arranged along the length direction of the electronic device 10 (e.g., y-axis direction) between the first fixed guide 430a and the second fixed guide 430b, such as to be substantially aligned with each other. In the first state, at least a portion of the first fixed guide 430a may be disposed on the same line (e.g., a line parallel to the y-axis direction) as at least some of the second fixed guide 430b and the connection guides 440. That is, first state may include the first fixed guide 430a aligned with or overlapping the second fixed guide 430b along the y-axis direction.

In the second state, with reference to the first direction, the first fixed guide 430a, the plurality of connection guides 440, and the second fixed guide 430b may be arranged in that order.

In the second state, the connection guides 440 may be disposed at positions displaced from the first fixed guide 430a along the width direction of the electronic device 10 (e.g., the x-axis direction) and the length direction of the electronic device 10 (e.g., the y-axis direction). For example, the connection guides 440 may be disposed at positions displaced from the first fixed guide 430a in the width direction and length direction of the electronic device 10. With reference to one connection guide 440, other connection guides 440 may be disposed at positions displaced along the width direction and length direction of the electronic device 10. Here, the second state may include the guides of the sliding device 400 (e.g., 430a, 430b and each 400) in a staggered arrangement along the x-y plane.

In the second state, the second fixed guide 430b may be disposed at a position displaced from at least one connection guide 440 in the width direction and length direction of the electronic device 10.

In an embodiment, one or more elastic members 450 may be disposed on the guides 430a, 430b, and 440. That is, each of the guides 430a, 430b, and 440 may include one or more clastic members 450. For example, the elastic members 450 may be disposed on the first fixed guide 430a, the second fixed guide 430b, and the connection guides 440, respectively. The clastic members 450 may be disposed between two connection guides 440, between the first fixed guide 430a and an adjacent connection guide 440, and between a connection guide 440 and the second fixed guide 430b, respectively. That is, a same one elastic member 450 may be common to a previous guide among the guides 430a, 430b, and 440 and a next guide among the guides 430a, 430b, and 440 which is sequentially after the previous guide along one of the +y-axis direction and the −y-axis direction.

In an embodiment, the elastic members 450 may be springs with elastic force. The clastic members 450 may serve to provide elastic force to the sliding device 400. The elastic force may be a biasing force in the +x-axis direction, without being limited thereto The connection guides 440 and the second fixed guide 430b may be elastically moved in the first direction or the second direction by compression or expansion of the elastic members 450 along the sliding direction. The second housing 300 (see FIG. 3B) connected to the second fixed guide 430b may also be elastically moved in the first direction or the second direction by the clastic force provided by the clastic members 450.

In an embodiment, a length of the first grooves 410 and the second grooves 420 may increase in one direction along the length direction of the electronic device 10. For example, referring to FIG. 5A, the length of the first groove 410 located adjacent to one side (e.g., the side surface oriented in the −y-axis direction) of the sliding device 400 may be smaller than the length of the first groove 410 located adjacent the other side of the sliding device 400. That is, lengths of the sliding grooves (e.g., the first grooves 410 and the second grooves 420) increase in a same one direction along the y-axis direction.

In an embodiment, the connection guides 440 disposed in the first groove 411, respectively, may be slidably moved in the first direction along the first grooves 411. Since the lengths of the first grooves 410 vary depending on the positions of the first groove 411, the positions at which connection guides 440 are displaced in the first direction in the second state may also vary depending on the lengths of the first grooves 411 in which the connection guides 440 are disposed, respectively.

In an embodiment, the drive coupling member 460 may be at least partially connected to the second fixed guide 430b. For example, the drive coupling member 460 may be coupled and connected to the second fixed guide 430b at one end thereof. When the second fixed guide 430b is moved, the drive coupling member 460 may also be moved. For example, referring to FIG. 5B, in the second state, when the second fixed guide 430b is moved in the first direction, the drive coupling member 460 may also move in the first direction together with the second fixed guide 430b. That is, among the guides 430a, 430b, and 440, the guide 430a is fixedly connected to the first housing 200 while the guide 430b is fixedly connected to the drive coupling member 460 as a coupling member.

Referring to FIG. 5C, a connection guide 440 may include a first area 441, a second area 442, a connection area 443, a slide area 444, and/or a seating portion 445. Each of these areas may be considered a portion of an overall body of the connection guide 440. The connection guide 440 may have a first end and a second end opposite to each other along the sliding direction (e.g., the x-axis direction).

In an embodiment, the first area 441 may extend in the length direction of the electronic device 10 (e.g., the y-axis direction). The first area 441 may have ends opposing each other in the length direction.

In an embodiment, the second area 442 may extend in the length direction of the electronic device 10 and also having ends opposing each other in the length direction (e.g., the y-axis direction). The second area 442 may be located at a distance from one end of the connection guide 440 which is defined at the first area 441 in the first direction. For example, the second area 442 may be provided at a position displaced from one end of the connection guide 440 (e.g., the distal end of the first area 441 oriented in the −y-axis direction).

In an embodiment, the first area 441 and the second area 442 may be connected to each other by the connection area 443 extending in the width direction of the electronic device 10. The first area 441 may be connected to one end of the connection area 443 at one end of the first area 441 (e.g., the distal end of the first area 441 oriented in the −y-axis direction), and the second area 442 may be connected to the other end of the connection area at one end of the second area 442 (e.g., the end of the second area 442 oriented in the +y-axis direction).

In an embodiment, a slide area 444 may be provided in at least a portion of each of the first area 441 and the second area 442. For example, a slide area 444 may extend in the first direction from the distal end of the connection guide 440 at the first area 441. A slide area 444 may extend in the second direction from the distal end of the connection guide 440 at the second area 442. The connection guide 440 may be in contact with other connection guides 440 or the fixed guide 430a or 430b at the slide areas 444 to slide in the first direction and the second direction. Here, the slide areas 444 may represent a protrusion and/or a groove which are discussed above.

In an embodiment, a seating portion 445 may extend from an inner surface of the connection guide 440 at the first area 441 in the first direction. A seating portion 445 may extend in the second direction from an inner surface of the connection guide 440 at the second area 442.

Referring to FIG. 5C, the connection guide 440 may have a general 'S' shape with two grooves open in different directions from each other along the sliding direction. The seating portions 445 within a same connection guide 440 are respectively disposed in the two grooves to be exposed to outside the same connection guide 440 in the −x-axis direction and the +x-axis direction.

In an embodiment, when the second fixed guide 430b is located adjacent to a connection guide 440 in the first direction, the connection guide 440 may be disposed at a position where the seating portion 445 provided in the first area 441 the connection guide 440 faces a seating portion 431b of the second fixed guide 430b located in the first direction. The seating portions 445 and 431b may be aligned with each other along the sliding direction. FIG. 5A shows the seating portions 445 and 431b at a distance from each other while FIG. 5B shows the seating portions 445 and 431b further away from each other than in FIG. 5A, along the sliding direction.

In an embodiment, when another connection guide 440 is located in the first direction of the connection guide 440 (e.g., two sequential connection guides 440 along the y-axis direction), the connection guide 440 may be disposed at a position where the seating portion 445 provided in the first area 441 faces the seating portion 445 in the second area 442 of another connection guide 440 located in the first direction. Here, the connection guide 440 may be a previous connection guide while the another connection guide 440 may follow the previous connection guide in the +y-axis direction.

In an embodiment, two elastic members 450 may be disposed in one connection guide 440. For example, the two elastic members 450 may be disposed on the seating portions 445, respectively, which are provided in the first area 441 and the second area 442. One elastic member 450 may be disposed extended in the first direction with reference to the first area 441, and the remaining elastic member 450 may be disposed extended in the second direction with reference to the second area 442.

In an embodiment, the first fixed guide 430*a* may include a seating portion 431*a*, a fixing area 432*a*, and/or a slide area 434*a*.

In an embodiment, the seating portion 431*a* may be extend from the first fixed guide 430*a* in the first direction. The seating portion 431*a* may be disposed to face the seating portion 445 provided in the second area 442 located in the first direction of the first fixed guide 430*a* of a following connection guide 440.

In an embodiment, the clastic member 450 located in the first direction of the first fixed guide 430*a* may be disposed on or engaged with the seating portion 431*a* of the first fixed guide 430*a*.

In an embodiment, the fixing area 432*a* may extend from the first fixed guide 430*a* in the second direction. The first fixed guide 430*a* may be coupled to the first housing 200 (see FIG. 3A) at the fixing area 432*a* using a separate fastening member (not illustrated) or welding. The separate fastening member (not illustrated) may include a bolt and/or a rivet. When the fastening member (not illustrated) is a bolt, a bolt with a thread on the surface may be fixed to the first fixed guide 430*a* by a screw fastening method. When the fastening member (not illustrated) is a rivet, a rivet made of metal may be fixed to the first fixed guide 430*a*. When welding is used for coupling, the first fixed guide 430*a* to be coupled may be partially melted through welding and coupled to the first housing 200 (see FIG. 3A).

In an embodiment, a slide area 434*a* of the first fixed guide 430*a* may extend from at least a portion of the first fixed guide 430*a* in the first direction. The first fixed guide 430*a* may be in contact with at least one connection guide 440 in the slide area 434*a* to slide in the first direction and the second direction.

In an embodiment, the second fixed guide 430*b* may include a seating portion 431*b* and/or a slide area 434*a*.

In an embodiment, the seating portion 431*b* may extend from the second fixed guide 430*b* in the second direction. The seating portion 431*b* may be disposed to face the seating portion 445 provided in the first area 441 located in the second direction of the second fixed guide 430*b* of a previous connection guide 440.

In an embodiment, the elastic member 450 located extended in the second direction of the second fixed guide 430*b* may be disposed on or engaged with the seating portion 431*b* of the second fixed guide 430*b*.

In an embodiment, a slide area 434*b* may extend from at least a portion of the second fixed guide 430*b* in the second direction. The second fixed guide 430*b* may be in contact with at least one connection guide 440 (e.g., a previous connection guide 440) in the slide area 434*b* to slide in the first direction and the second direction.

In an embodiment, the slide areas 434*a*, 434*b*, and 444 of the first fixed guide 430*a*, the second fixed guide 430*b*, and the connection guides 440 may include at least one of a connection groove 448 (see FIG. 4B) and a connection protrusion 449 (see FIG. 4B). That is, the positions and/or lengths of the various slide areas 434*a*, 434*b*, and 444 shown in FIGS. 5A, 5B and 5C may represent positions and/or lengths of a connection groove 448 (as one or more of 448-1 and 448-2) and/or a connection protrusion 449 (as one or more of 449-1 and 449-2).

In an embodiment, the seating portions 431*a*, 431*b*, and 445 of the first fixed guide 430*a*, the second fixed guide 430*b*, and the connection guides 440 may include a cylindrical shape extending in the width direction of the electronic device 10 (e.g., the x-axis direction). That is, a major dimension of a respective seating portion extends in the x-axis direction and may have a circular cross section along a y-z plane, without being limited thereto.

In an embodiment, the clastic members 450 disposed in the first areas 441 and the second areas 442 of a same connection guide 440 are disposed at different positions in the length direction of the electronic device 10. Thus, a rotational moment may be generated in the connection guide 440 about a rotational axis parallel to the x-axis direction due to the elastic members 450 disposed in the first area 441 and the second area 442. The slide areas 434*a*, 434*b*, and 444 of the first fixed guide 430*a*, the second fixed guide 430*b*, and the connection guides 440 may serve to prevent each connection guides 440 from rotating by the rotational moment generated in the connection guide 440.

Referring to FIGS. 5A and 5B, a same one clastic member 450 of a respective guide among the guides 430*a*, 430*b*, and 440 is common to another guide among the guides 430*a*, 430*b*, and 440, either a preceding guide or a following guide.

Figure 6A:
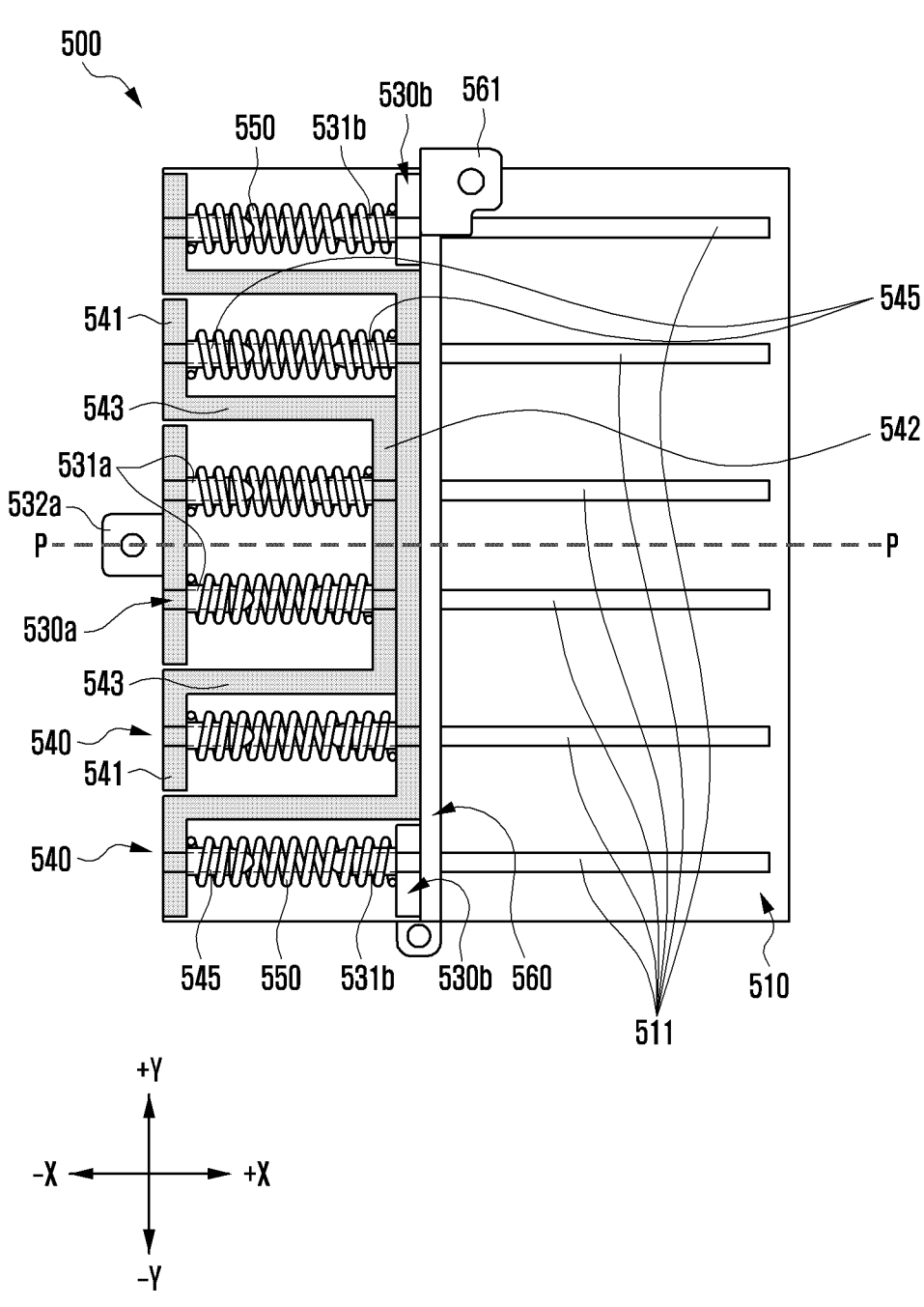
FIGS. 6A and 6B are plan views illustrating a sliding device according to another embodiment of the disclosure.

FIG. 6A is a plan view illustrating a first state of a sliding device 500 according to an embodiment of the disclosure.

Figure 6B:
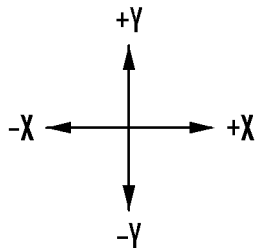

FIG. 6B is a plan view illustrating a second state of a sliding device 500 according to an embodiment of the disclosure.

In an embodiment, a first direction may refer to the direction in which the second housing 300 (see FIG. 3A) moves away from the first housing 200 (see FIG. 3A) in the +x-axis direction, and a second direction may refer to the direction in which the second housing 300 (see FIG. 3A) moves toward the first housing 200 (see FIG. 3A) in the −x-axis direction. In describing the sliding device 500 according to an embodiment of the disclosure, the first state may refer to the state in which the second housing 300 (see FIG. 3A) is located closest to the first housing 200 (see FIG. 3A) in the first direction. The first state may refer to the state in which a second fixed guide 530*b* of the sliding device 500 is moved to the minimum from a first fixed guide 530*a* in the first direction.

In describing the sliding device 500 according to an embodiment of the disclosure, the second state may refer to the state in which the second housing 300 (see FIG. 3A) is located farthest to the first housing 200 (see FIG. 3A) in the first direction. The second state may refer to the state in which the second fixed guide 530*b* of the sliding device 500 is moved to the maximum from the first fixed guide 530*a* in the first direction. The second fixed guide 530*b* and the first fixed guide 530*a* may be considered outermost guides among the guides 530*a*, 530*b* and 540.

In an embodiment, while a connection guide 540 and the second fixed guide 530*b* of the sliding device 500 are moved in the first direction and the second direction, the second housing 300 (see FIG. 3A) may be moved in the first direction and the second direction.

In an embodiment, the first fixed guide 530*a* may be disposed in a first groove 511 provided adjacent to the center of a first plate 510 with reference to the length direction of the electronic device 10 (e.g., the y-axis direction). For example, referring to FIG. 6A, it may be assumed that the imaginary straight line P-P passes through the center of the first plate 510 which is defined along the length direction of the electronic device 10. The first fixed guide 530*a* may be disposed in the first groove 511 provided adjacent to (e.g., closest to or overlapping) the imaginary straight line P-P.

In an embodiment, the sliding device 500 may include two second fixed guides 530*b*. The two second fixed guides 530*b* may be disposed in first grooves 511 provided adjacent to one side and the other side of the first plate 510, respectively.

In an embodiment, the position of the first fixed guide 530*a* may be fixed on one surface of the first plate 510. For example, the first fixed guide 530*a* may be fixed in position on the first plate 510 by being coupled to the first plate 510 with a separate fastening member (not illustrated).

A plurality of connection guides 540 according to an embodiment of the disclosure may be disposed between the first fixed guide 530*a* and the second fixed guides 530*b*. For example, with reference to the first direction, the first fixed guide 530*a*, the plurality of connection guides 540, and the second fixed guides 530*b* may be arranged in that order.

When the sliding device 500 according to an embodiment of the disclosure switches from the first state to the second state, the distances between the first fixed guide 530*a* and at least some of the connection guides 540 (e.g., the distances in the x-axis direction) may be increased. The distances between at least some of the connection guides 540 and the second fixed guides 530*b* (e.g., the distances in the x-axis direction) may also be increased.

In an embodiment, clastic members 550 may be disposed on or engaged with the first fixed guide 530*a*, the second fixed guides 530*b*, and the connection guides 540, respectively. For example, the elastic members 550 may be disposed between two connection guides 540 adjacent to each other, between the first fixed guide 530*a* and a connection guide 540 adjacent to each other, and between a connection guide 540 and the second fixed guides 530*b* adjacent to each other, respectively. The elastic members 550 may be disposed on the seating portions 531*a*, 531*b*, and 545 provided on the first fixed guide 530*a*, the second fixed guides 530*b*, and the connection guides 540.

In an embodiment, the elastic members 550 may be springs with elastic force. The elastic members 550 may serve to provide elastic force to the sliding device 500. The connection guides 540 and the second fixed guides 530*b* may be elastically moved in the first direction or the second direction by the elastic members 550. The second housing 300 (see FIG. 3B) connected to the second fixed guides 530*b* may also be elastically moved in the first direction or the second direction by the elastic members 550.

Referring to FIGS. 6A and 6B, the drive coupling member 560 may be fixedly connected to each of the two second fixed guides 530*b*. For example, the drive coupling member 560 may be coupled and connected to the two second fixed guides 530*b* at one end and the other end thereof, respectively.

In an embodiment, when the second fixed guides 530*b* are moved, the drive coupling member 560 may also be moved. For example, referring to FIG. 6B, in the second state, when the second fixed guides 530*b* are moved in the first direction, the drive coupling member 560 may also move in the first direction together with the second fixed guides 530*b*.

In an embodiment, the drive coupling member 560 may include a coupling area 561. The drive coupling member 560 may be coupled to the second housing 300 (see FIG. 3B) in the coupling area 561 using a separate fastening member (not illustrated).

Referring to FIGS. 6A and 6B, the connection guides 540 may each include a first area 541, a second area 542, a connection area 543, and/or a seating portion 545. The connection guide 540 may have a base "U" shape with two extended portions (e.g., the first areas 541).

In an embodiment, two first areas 541 may extend in the length direction of the electronic device 10 (e.g., the y-axis direction). The two first areas 541 may be located at a distance from each other in the length of the electronic device 10 direction (e.g., the y-axis direction).

In an embodiment, the two first areas 541 may be arranged art positions symmetrical about the imaginary straight line P-P passing through the first fixed guide 530*a*.

In an embodiment, the second area 542 may extend in the length direction of the electronic device 10 (e.g., the y-axis direction). A second area may be located at a distance from one ends of the two first areas 541 (e.g., the distal end of the first area 541 facing the other first area 541) in the first direction.

In an embodiment, the two first areas 541 are connected to the second area 542 by two connection areas 543, respectively, which extend in the width direction of the electronic device 10 (e.g., the x-axis direction).

In an embodiment, the seating portions 545 at the first areas 541 may extend from the first areas 541 in the first direction. For example, at least some portions of the two first areas 541 may open in the first direction, and the seating portions 545 may be provided on the first areas, respectively, to be exposed in the first direction.

In an embodiment, two seating portions 545 at the second areas 542 may extend from the second area 542 in the second direction. The two seating portions 545 provided in the second area 542 may be disposed spaced apart from each other at an interval in the length direction of the electronic device (e.g., the y-axis direction).

The guides 530*a*, 530 and 540 may be considered arranged consecutively in the first direction, from which a previous guide and a following guide can be referenced. In an embodiment, when another (following) connection guide 540 is located in the first direction of a (previous) connection guide 540, the seating portions 545 provided in the first areas 541 of the connection guide 540 may be disposed at positions facing the seating portions 545 provided in the second area 542 of the another connection guide 540 located in the first direction. For example, two seating parts 545 provided in the two first areas 541 of the previous guide may be disposed, respectively, at positions facing the two seating portions 545 provided in the second area 542 of the following connection guide 540 located in the first direction.

In an embodiment, when the second fixed guides 530*b* as following guides are located in the first direction of a (previous) connection guide 540, the seating portions 545 provided in the first areas 541 may be disposed at positions facing the seating portions 531*b* of the second fixed guides 530*b* located in the first direction. For example, the seating portions 545 provided in the two first areas 541 may be disposed at positions facing the seating portions 531*b* of the two second fixed guides 530*b* located in the first direction.

In an embodiment, the second area 542 of the connection guide 540 may extend to have the same length, in the length direction of the electronic device 10, as the other connection guide 540 located in the second direction of the connection guide 540. Referring to FIGS. 6A and 6B, for example, the second area 542 of the connection guide 540 may extend to have a same length, in the length direction of the electronic device 10, as an overall length of the other connection guide 540 located in the second direction of the connection guide 540.

In an embodiment, when the first fixed guide 530*a* is located in the second direction of the connection guide 540, the second area 542 of the connection guide 540 may extend to have the same length, in the length direction of the electronic device 10, as the first fixed guide 530*a* located in the second direction of the connection guide 540. Referring again to FIGS. 6A and 6B, for example, the second area 542 of the leftmost connection guide 540 may extend to have a same length, in the length direction of the electronic device 10, as an overall length of the first fixed guide 530*a*.

In an embodiment, the first fixed guide 530*a* may include a seating portion 531*a* and/or a fixing area 532*a*.

In an embodiment, the first fixed guide 530*a* may include two seating portions 531*a*. The two seating portions 531*a* may be spaced apart by an interval in the length direction of the electronic device 10 (e.g., the y-axis direction) and may extend in the first direction of the first fixed guide 530*a*. The two seating portions 531*a* may be disposed to face, respectively, the seating portions 545 provided in the second area 542 of the connection guide 540 located in the first direction of the first fixed guide 530*a*.

In an embodiment, the two clastic members 550 located in the first direction of the first fixed guide 530*a* may be disposed, respectively, on the two seating portions 531*a* of the first fixed guide 530*a*.

In an embodiment, the fixing area 532*a* may be an area extending from the first fixed guide 530*a* in the second direction (e.g., the −x-axis direction). The first fixed guide 530*a* may be coupled to the first housing 200 (see FIG. 3A) in the fixing area 532*a* using a separate fastening member (not illustrated). For example, the fastening member (not illustrated) may be a bolt with a thread.

In an embodiment, the second fixed guides 530*b* may include seating portions 531*b*.

In an embodiment, the seating portions 531*b* may extend from the second fixed guides 530*b* in the second direction. The clastic members 550 located in the second direction of the second fixed guides 530*b* may be disposed on the seating portions 531*b* of the second fixed guides 530*b*. For example, two second fixed guides 530*b* may each include a seating portion 531*b* extending in the second direction, and two clastic members 550 may be disposed on the two seating portions 531*b*, respectively.

In an embodiment, the seating portions 531*a*, 531*b*, and 545 of the first fixed guide 530*a*, the second fixed guides 530*b*, and the connection guides 540 may include a cylindrical shape extending in the width direction of the electronic device 10 (e.g., the x-axis direction).

In the sliding device 500 according to an embodiment of the disclosure, the first fixed guide 530*a*, the second fixed guides 530*b*, and the connection guides 540 may be symmetrically arranged about the imaginary straight line P-P. Due to the symmetrical arrangement structure of the guides 530*a*, 530*b*, and 540, no rotational moment may be generated in the sliding device 500. Within the planar area of the sliding device 500, the guides 530*a*, 530*b* and 540 may be nested with each other along the sliding direction.

The sliding device 500 according to an embodiment of the disclosure may enable more clastic members 550 to be arranged in the same space compared to the sliding device 400 illustrated in FIG. 5A. That is, a relative number of clastic members 550 within a same planar area of the sliding device may correspond to a relative load of the structure which is slidably moveable relative to the first housing 200.

Figure 7A:
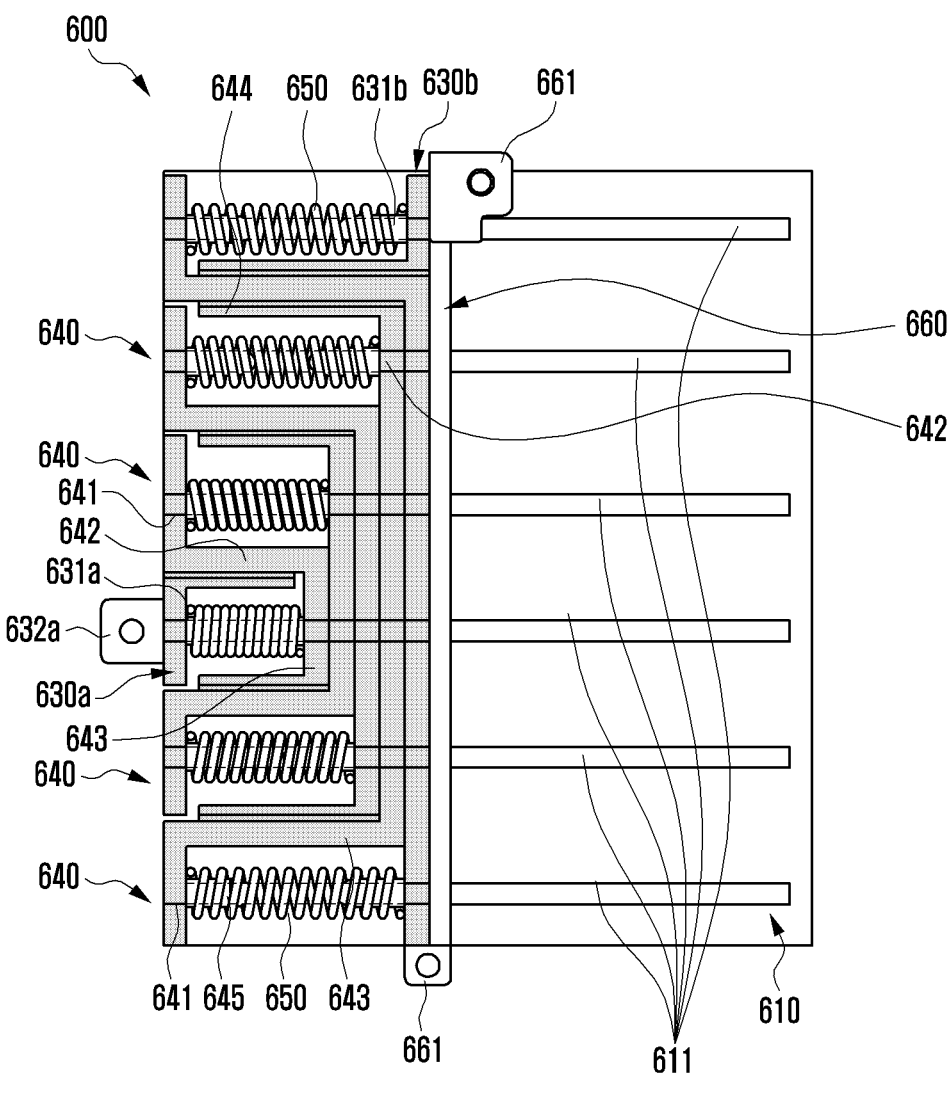
FIGS. 7A and 7B are plan views illustrating a sliding device according to still another embodiment of the disclosure.
Figure 7A:
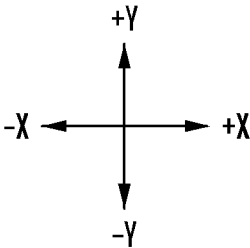

FIG. 7A is a plan view illustrating a first state of a sliding device 600 according to an embodiment of the disclosure.

Figure 7B:
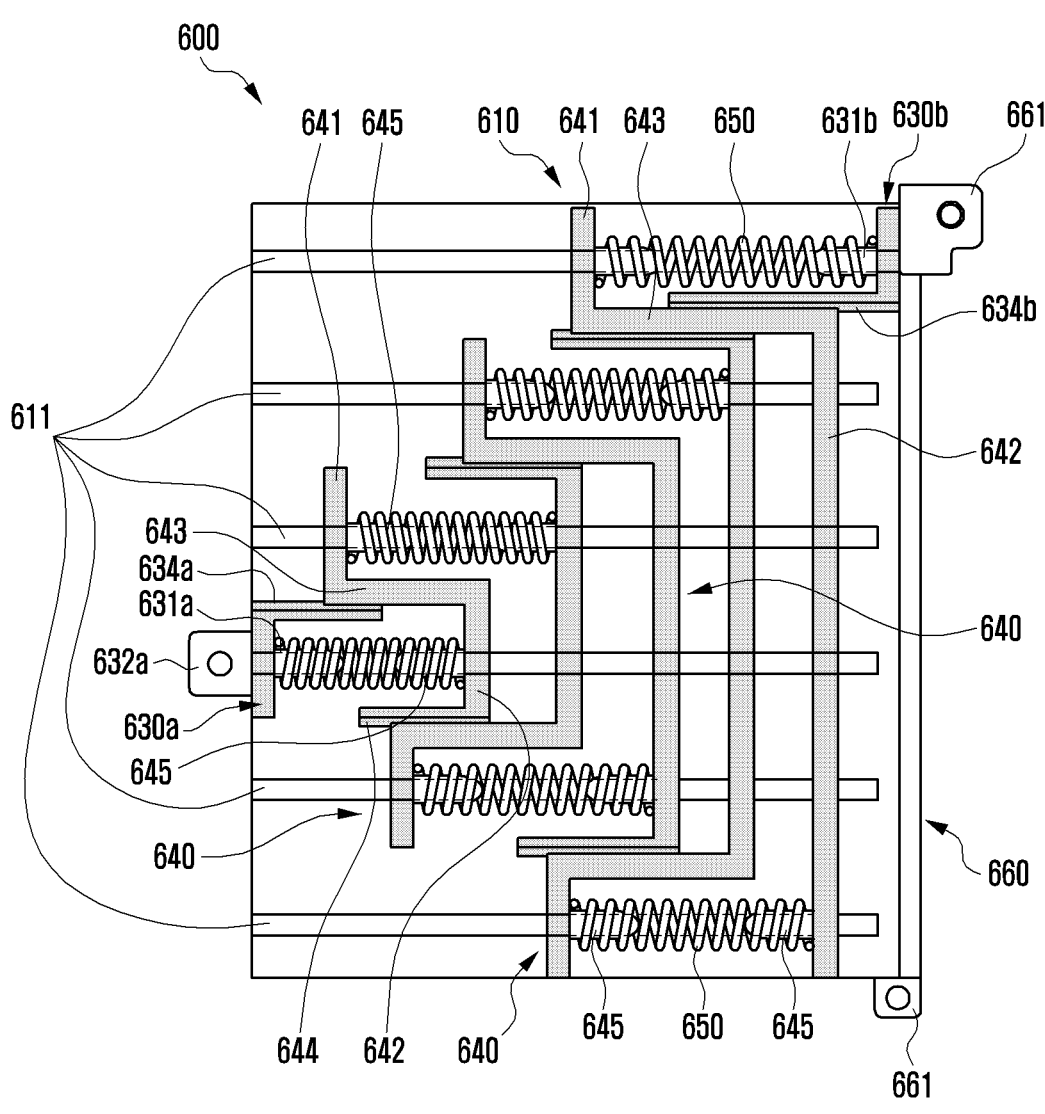
Figure 7B:
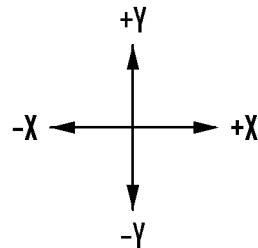

FIG. 7B is a plan view illustrating a second state of the sliding device 600 according to an embodiment of the disclosure.

In an embodiment, a first direction may refer to the direction in which the second housing 300 (see FIG. 3A) moves away from the first housing 200 (see FIG. 3A) in the +x-axis direction, and a second direction may refer to the direction in which the second housing 300 (see FIG. 3A) moves toward the first housing 200 (see FIG. 3A) in the −x-axis direction.

In describing the sliding device 600 according to an embodiment of the disclosure, the first state may refer to the state in which the second housing 300 (see FIG. 3A) is located closest to the first housing 200 (see FIG. 3A) in the first direction. The first state may refer to the state in which a second fixed guide 630*b* of the sliding device 600 is moved to the minimum from the first fixed guide 630*a* in the first direction.

In describing the sliding device 600 according to an embodiment of the disclosure, the second state may refer to the state in which the second housing 300 (see FIG. 3A) is located farthest to the first housing 200 (see FIG. 3A) in the first direction. The second state may refer to the state in which the second fixed guide 630*b* of the sliding device 600 is moved to the maximum from the first fixed guide 630*a* in the first direction.

In an embodiment, while a connection guide 640 and the second fixed guide 630*b* of the sliding device 600 are moved in the first direction and the second direction, the second housing 300 (see FIG. 3A) may be moved in the first direction and the second direction.

In an embodiment, the first fixed guide 630*a* may be disposed in a first groove 611 provided adjacent to the center of a first plate 610 with reference to the length direction of the electronic device 10 (e.g., the y-axis direction).

In an embodiment, the second fixed guide 630*b* may be disposed in the first groove 611 provided adjacent to one side or the other side of the first plate 610. FIGS. 7A and 7B illustrate that the second fixed guide 630*b* is disposed adjacent to the other side of the first plate 610, but the arrangement of the second fixed guide 630*b* is not limited thereto. The second fixed guide 630*b* may be disposed adjacent to one side (e.g., the side oriented in the −x-axis direction) of the first plate 610, or adjacent to the other side (e.g., the side oriented in the +x-axis direction) of the first plate 610.

In an embodiment, the position of the first fixed guide 630*a* may be fixed on one surface of the first plate 610. For example, the first fixed guide 630*a* may be fixed in position on the first plate 610 by being coupled to the first plate 610 with a separate fastening member (not illustrated).

A plurality of connection guides 640 according to an embodiment of the disclosure may be arranged between the first fixed guide 630*a* and the second fixed guides 630*b*. For example, with reference to the first direction, the first fixed guide 630*a*, the plurality of connection guides 640, and the second fixed guides 630*b* may be arranged in that order.

When the sliding device 600 according to an embodiment of the disclosure switches from the first state to the second state, the distances between the first fixed guide 630*a* and at least some of the connection guides 640 may be increased with reference to the first direction. The distances between at least some of the connection guides 640 and the second fixed guide 630*b* in the first direction may also be increased.

In an embodiment, clastic members 650 may be disposed on the first fixed guide 630a, the second fixed guide 630b, and the connection guides 640, respectively. For example, the elastic members 650 may be commonly disposed between two connection guides 640, between the first fixed guide 630a and a connection guide 640, and between a connection guide 640 and the second fixed guide 630b, respectively. The clastic members 650 may be disposed on the seating portions 631a, 631b, and 645 provided on the first fixed guide 630a, the second fixed guide 630b, and the connection guides 640, respectively.

In an embodiment, the clastic members 650 may be springs with clastic force. The clastic members 650 may serve to provide elastic force to the sliding device 600. The connection guides 640 and the second fixed guide 630b may be elastically moved in the first direction or the second direction by the clastic members 650. The second housing 300 (see FIG. 3B) connected to the second fixed guide 630b may also be elastically moved in the first direction or the second direction by the clastic members 650.

Referring to FIGS. 7A and 7B, the drive coupling member 660 may be connected to the second fixed guide 630b. For example, the drive coupling member 660 may be coupled and connected to the second fixed guide 630b at one end thereof.

In an embodiment, when the second fixed guide 630b are moved, the drive coupling member 660 may also be moved. For example, referring to FIG. 7B, in the second state, when the second fixed guide 630b is moved in the first direction, the drive coupling member 660 may also move in the first direction following the second fixed guide 630b.

In an embodiment, the drive coupling member 660 may include a coupling area 661. The drive coupling member 660 may be coupled to the second housing 300 (see FIG. 3B) in the coupling area 661 using a separate fastening member (not illustrated).

Referring to FIGS. 7A and 7B, the connection guides 640 may each include a first area 641, a second area 642, a connection area 643, a slide area 644, and/or a seating portion 645. The connection guide 640 may have a base "U" shape with one extended portion (e.g., the first areas 641) at one end of the "U" shape along the length direction. For the connection guide 640, the first area 641 as an extension to the "U" shape alternates positions along the length direction. For example, when a previous guide 640 has the extended portion at the +y-axis side of the second area 642 the next or following guide 640 has the extended portion at the −y-axis side of the second area 642.

In an embodiment, the first area 641 may extend in the length direction of the electronic device 10 (e.g., the y-axis direction).

In an embodiment, the second area 642 may extend in the length direction of the electronic device 10 (e.g., the y-axis direction). The second area 642 may be located at a distance from one end or the other end of the first area 641 in the first direction. For example, the second area 642 may be located at a distance from one end (e.g., the end oriented in the −y-axis direction) of the first area 641 in the first direction, or may be located at a distance from the other end (e.g., the end oriented in the +y-axis direction) of the first area 641 in the first direction.

In an embodiment, connection guides 640, each of which includes a second area 642 located at a distance from one end of a first area 641, and connection guides, each of which includes a second area 642 located at a distance from the other end of a first area 641, may be alternately arranged along the first direction.

In an embodiment, the first area 641 and the second area 642 may be connected to each other by a connection area 643, which extends in the width direction of the electronic device 10 (e.g., the x-axis direction).

In an embodiment, the first area 641 may extend from the connection area 643 in the opposite direction to the first area 641 of another connection guide 640 located adjacent thereto in the first direction. For example, when the first area 641 of one connection guide 640 extends from the connection area 643 in the +y-axis direction, the first area 641 of another connection guide 640 located adjacent thereto in the first direction may extend from the connection area 643 in the −y-axis direction.

In an embodiment, a seating portion 645 may extend from the first area 641 in the first direction.

In an embodiment, a seating portion 645 may extend from the second area 642 in the second direction.

In an embodiment, when the second fixed guide 630b is located in the first direction of a connection guide 640, the connection guide 640 may be disposed at a position where the seating portion 645 provided in the first area 641 faces a seating portion 631b of the second fixed guide 630b located in the first direction.

In an embodiment, when another connection guide 640 is located in the first direction of a connection guide 640, the seating portion 645 provided in the first area 641 of the connection guide 640 may be disposed at a position facing the seating portion 645 provided in the second area 642 of the other connection guide 640 located in the first direction.

In an embodiment, the second area 642 of the connection guide 640 may extend to have the same length, in the length direction of the electronic device 10, as the other connection guide 640 located in the second direction of the connection guide 640.

In an embodiment, when the first fixed guide 630a is located in the second direction of the connection guide 640, the second area 642 of the connection guide 640 may extend to have the same length, in the length direction of the electronic device 10, as the first fixed guide 630a located in the second direction of the connection guide 640.

In an embodiment, a slide area 644 may be provided in at least a portion of the second area 642. For example, a slide area 644 may extend in the first direction from one end of the second area 642. The connection guide 640 may be in contact with the connection area 643 of another connection guide 640 in the slide area 644 to be slidable in the first direction and the second direction.

In an embodiment, the first fixed guide 630a may include a seating portion 631a, a fixing area 632a, and/or a slide area 634a.

In an embodiment, the seating portion 631a of the first fixed guide 630a may extend in the first direction of the first fixed guide 630a. The seating portion 631a may be disposed to face the seating portion 645 provided in the second area 642 of the connection guide 640 located in the first direction of the first fixed guide 630a.

In an embodiment, the elastic member 650 located in the first direction of the first fixed guide 630a may be disposed on the seating portion 631a of the first fixed guide 630a.

In an embodiment, the fixing area 632a may be an area extending from the first fixed guide 630a in the second direction (e.g., the −x-axis direction). The first fixed guide 630a may be coupled to the first housing 200 (see FIG. 3A) in the fixing area 632a using a separate fastening member (not illustrated). For example, the fastening member (not illustrated) may be a bolt with a thread.

In an embodiment, a slide area 634a may extend from at least a portion of the first fixed guide 630a in the first direction. The first fixed guide 630a may be in contact with at least one connection guide 640 in the slide area 634a to slide in the first direction and the second direction.

In an embodiment, the second fixed guide 630b may include a seating portion 631b and/or a slide area 634b.

In an embodiment, the seating portion 631b may extend from the second fixed guide 630b in the second direction. The elastic member 450 located in the second direction of the second fixed guide 630b may be disposed on the seating portion 631b of the second fixed guide 630b.

In an embodiment, the seating portion 631b of the second fixed guide 630b may be provided at a position facing the seating portion 645 of the first area 641 of the connection guide 640 located in the second direction of the second fixed guide 630b.

In an embodiment, the slide area 634b may extend from at least a portion of the second fixed guide 630b in the second direction. The second fixed guide 630b may be in contact with at least one connection guide 640 in the slide area 634b to slide in the first direction and the second direction.

In an embodiment, the seating portions 631a, 631b, and 645 of the first fixed guide 630a, the second fixed guide 630b, and the connection guides 640 may include a cylindrical shape extending in the width direction of the electronic device 10 (e.g., the x-axis direction).

The sliding device 600 according to an embodiment of the disclosure may prevent the rotation of the connection guides 640 due to a rotational moment generated in the connection guides 640 by including the slide areas 634a, 634b, and 644. Within the planar area of the sliding device 600, the guides 630a, 630b and 640 may be nested with each other along the sliding direction.

In the sliding device 400, 500, or 600 according to an embodiment of the disclosure, since the directions in which the elastic members 450, 550, or 650 are compressed and tensioned and the directions in which the connection guides 440, 540, or 640 are moved (e.g., the first direction and the second direction) are the same, loss of force can be prevented.

In the sliding device 400, 500, or 600 according to an embodiment of the disclosure, the elastic members 450, 550, or 650 are arranged by stacking the elastic members in parallel along the longitudinal direction of the electronic device 10. Therefore, it is possible to arrange the sliding device 400, 500, or 600 even in a relatively narrow width structure.

In the sliding device 400, 500, or 600 according to an embodiment of the disclosure, a plurality of elastic members 450, 550, or 650 are disposed rather than disposing a single elongated elastic member. Therefore, it is possible to reduce permanent deformation of the elastic members 450, 550, or 650 by preventing each of the elastic members 450, 550, or 650 from entering a plastic deformation zone.

Figure 8A:
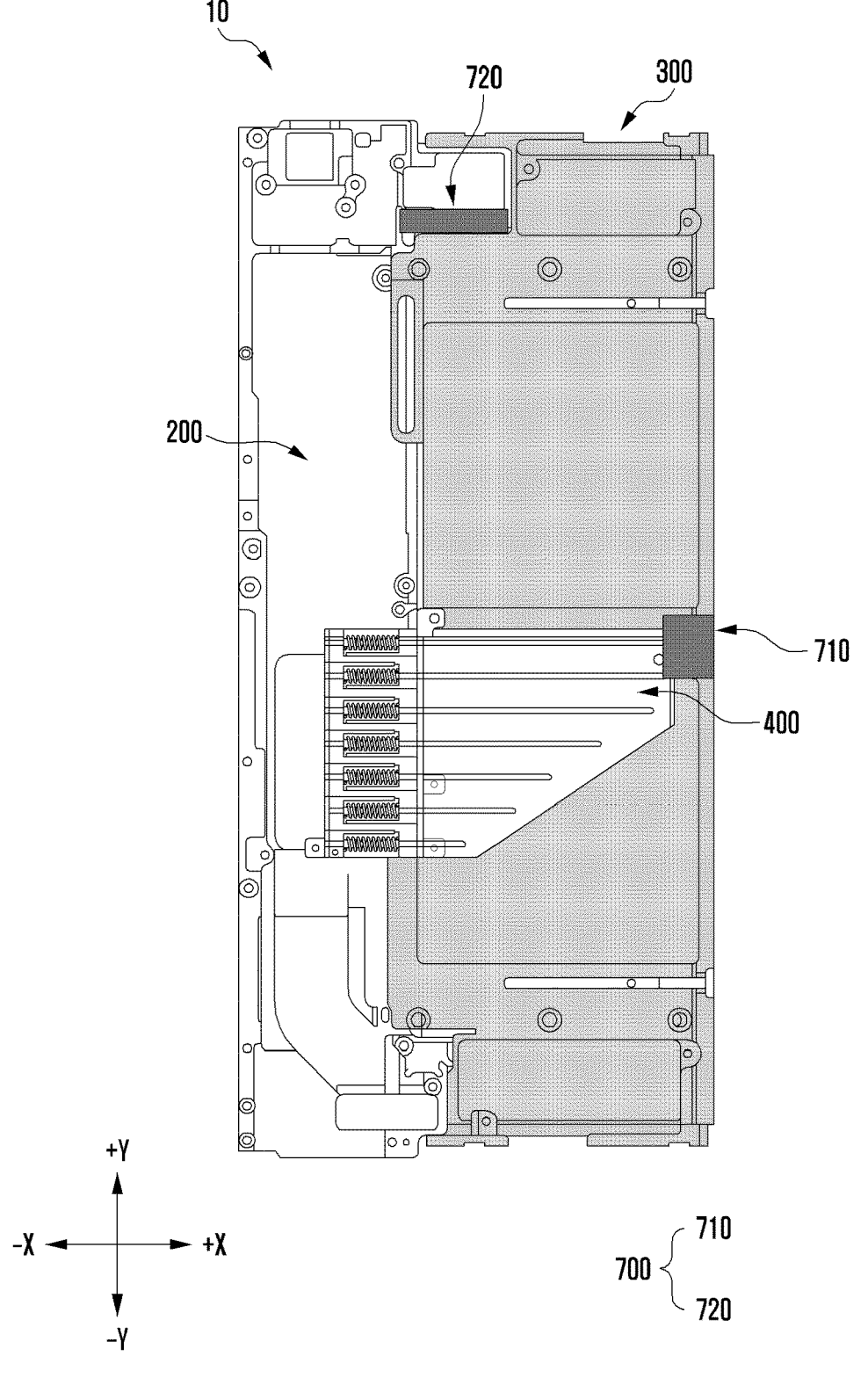
FIGS. 8A, 8B, 8C and 8D are views illustrating an electronic device including fixing members according to an embodiment of the disclosure.

FIG. 8A is a plan view illustrating a first state of an electronic device 10 including a fixing member 700 according to an embodiment of the disclosure.

Figure 8B:
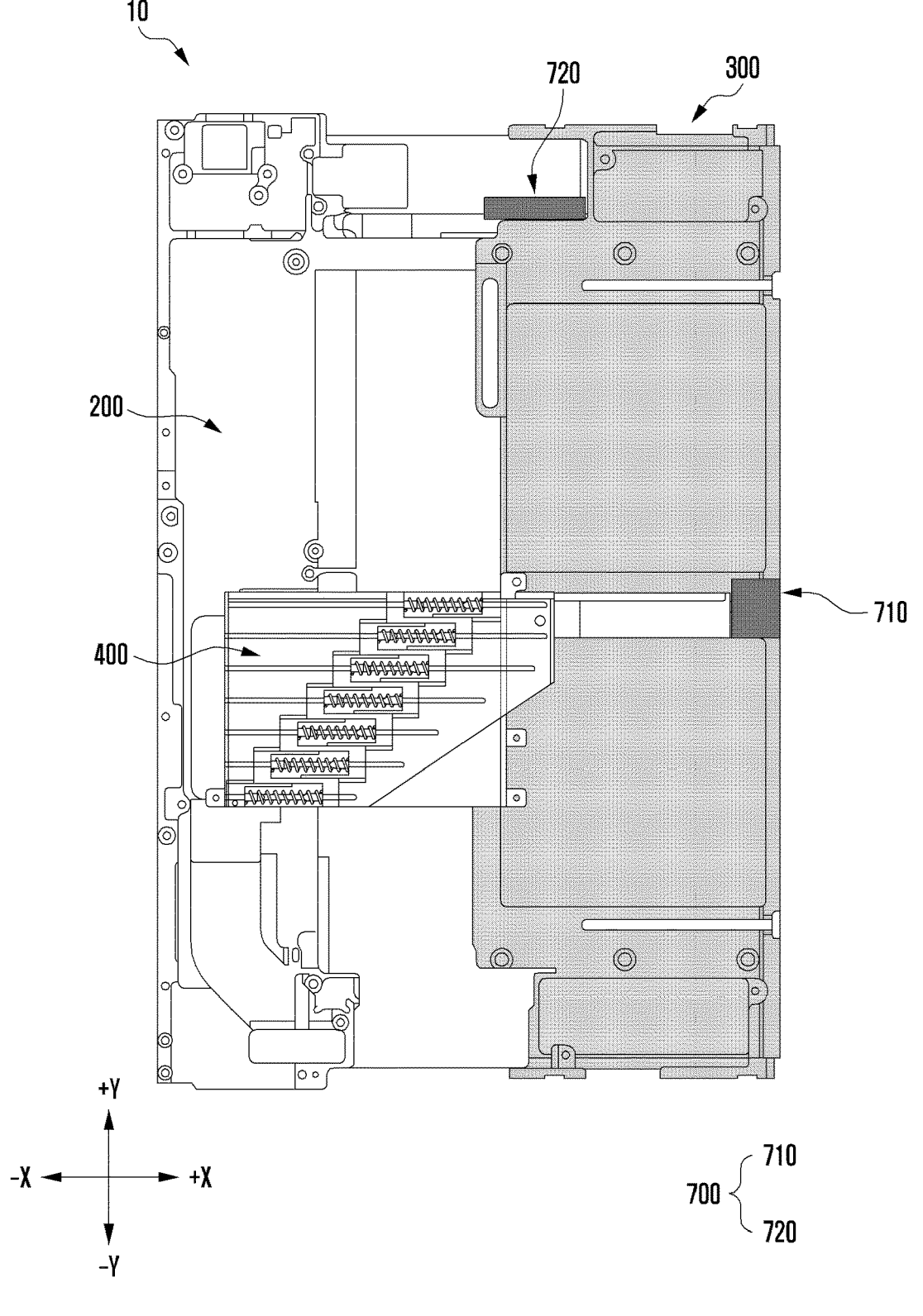

FIG. 8B is a plan view illustrating a second state of the electronic device 10 including the fixing member 700 according to an embodiment of the disclosure.

Figure 8C:
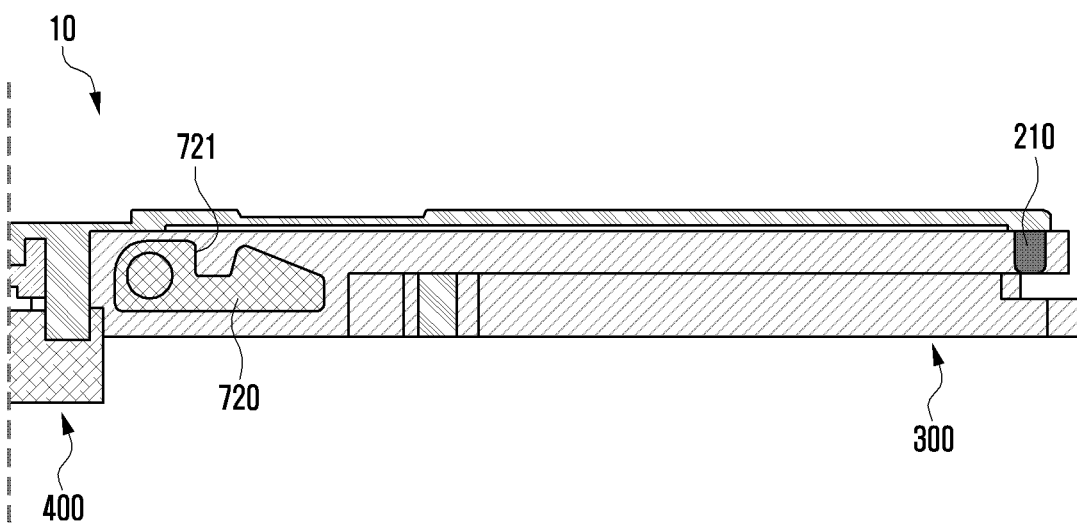
Figure 8C:
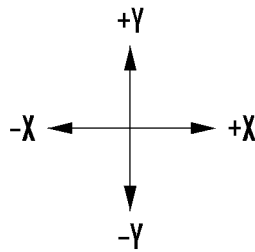

FIG. 8C is a plan view illustrating a second fixing member 720 in the first state of the electronic device 10 according to an embodiment of the disclosure.

Figure 8D:
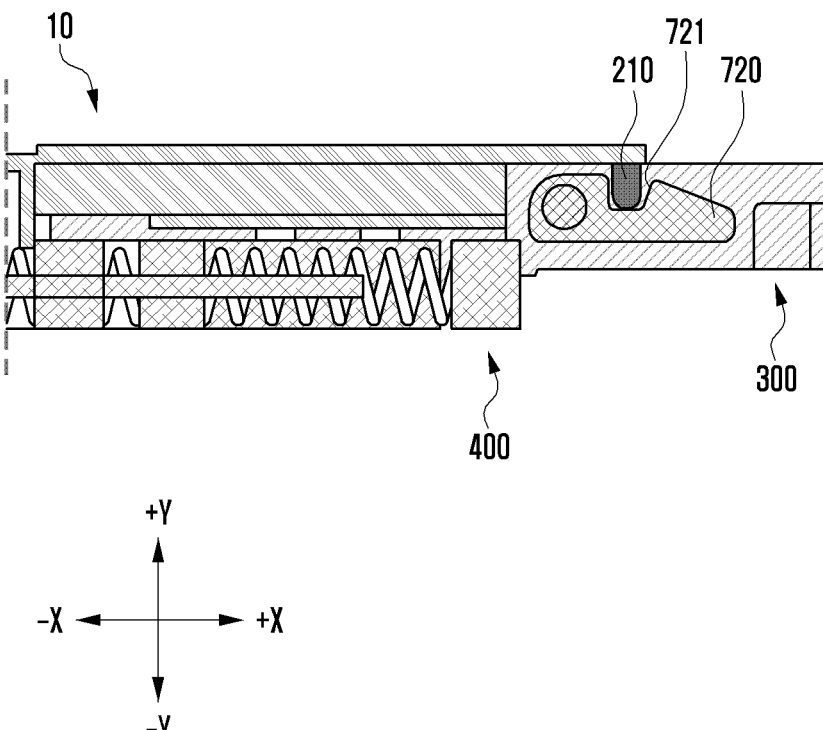

FIG. 8D is a plan view illustrating the second fixing member 720 in the second state of the electronic device 10 according to an embodiment of the disclosure.

In an embodiment, the first state may refer to the state in which a second housing 300 is located closest to a first housing 200 in the first direction. The second state may refer to the state in which the second housing 300 is located farthest to the first housing 200 in the first direction.

The electronic device 10 according to an embodiment of the disclosure may include a fixing member 700. The fixing member 700 may be disposed on at least a portion of the second housing 300. For example, FIGS. 8A and 8B show the fixing member 700 moved together with the second housing 300.

In an embodiment, the fixing member 700 may serve to fix the electronic device 10 in the first state or to fix the electronic device 10 in the second state.

In an embodiment, the fixing member 700 may include a first fixing member 710 and/or a second fixing member 720.

In an embodiment, the first fixing member 710 may be a member which fixes the electronic device 10 to maintain the first state. The first fixing member 710 may be switchable between a locked state or an unlocked state. When the electronic device 10 in the first state includes the first fixing member 710 in the locked state, the first fixing member 710 may prevent the second housing 300 from moving in the first direction with reference to the first housing 200. When the electronic device 10 in the first state includes the first fixing member 710 in the unlocked state, the second housing 300 is slidable in the first direction of the first housing 200 so that the electronic device 10 may be switched from the first state to the second state.

In an embodiment, when the electronic device 10 is in the first state, the first fixing member 710 may be in the locked state to prevent the second housing 300 from moving in the first direction. When the first fixing member 710 is in the locked state, the elastic members 450 (see FIG. 5A) of the sliding device 400 may be maintained in a compressed state.

In an embodiment, when the first fixing member 710 is switched from the locked state to the unlocked state, the connection guides 440 (FIG. 5A) may be movable in the first direction by a force in the +x-axis direction which is generated by the elastic members 450 which are compressed (see FIG. 5A). Here, the first fixing member 710 which is unlocked may allow a position of the second housing 300 relative to the first housing 200 to be variable, at any of a number of locations along the sliding direction.

In an embodiment, when the electronic device 10 is in the second state, the first fixing member 710 may be in the unlocked state.

In an embodiment, the first fixing member 710 may be disposed in the first direction (e.g., the +x-axis direction) with respect to the sliding device 400.

In an embodiment, the second fixing member 720 may be a member which fixes the electronic device 10 to maintain the second state. The second fixing member 720 may be switchable between the locked state or the unlocked state. When the second fixing member 720 is in the locked state, the second housing 300 may be fixed in the state of having been moved from the first housing 200 in the first direction (e.g., greater than the minimal distance therebetween). That is, the second fixing member 720 which is locked may fix a moved position of the second housing 300 relative to the first housing, at a location along the sliding direction. When the second fixing member 720 is in the unlocked state, the second housing 300 may be slidable in the first direction and the second direction of the first housing 200, relative to the moved position. That is, the second fixing member 720 which is unlocked may allow a position of the second housing 300 relative to the first housing 200 to be changed from the moved position.

In an embodiment, when the electronic device 10 is in the first state, the second fixing member 720 may be in the unlocked state to allow the second housing 300 to move in the first direction. When the electronic device 10 is in the second state, the second fixing member 720 may be in the locked state.

Referring to FIGS. 8C and 8D, the second fixing member 720 may include a fixing groove 721 in at least a portion thereof. At least a portion of the fixing groove 721 may have a concave shape in the −y-axis direction, to be open in the +y-axis direction.

Referring to FIGS. 8C and 8D, the electronic device 10 may include a slide stop area 210 in at least a portion thereof. The slide stop area 210 may have a shape in which at least a portion of the electronic device 10 protrudes and extends in the −y-axis direction. For example, the slide stop area 210 may be provided by a portion of the first housing 200 which extends in the −y-axis direction.

Referring to FIGS. 8C and 8D, in the first state, the second fixing member 720 and the slide stop area 210 may be located at a distance from each other in the first direction. Here, a slide stop (e.g., the slide stop area 210) may be disengaged from the fixing groove 721. When the electronic device 10 is switched from the first state to the second state, the distance between the second fixing member 720 and the sliding fixing area 210 may be reduced.

In an embodiment, in the second state, the elastic members 450 (see FIG. 5B) of the sliding device 400 may not be tensioned to the maximum. In the second state, when the clastic members 450 (see FIG. 5B) are not tensioned to the maximum, the clastic members 450 (see FIG. 5B) may continue to generate force in the first direction.

According to an embodiment, in the second state, the slide stop area 210 may be disposed in or engaged with the fixing groove 721 of the second fixing member 720. The slide stop area 210 may be disposed in the fixing groove 721 to support or resist the continued force applied in the first direction due to the clastic members 450 (see FIG. 5B). In the second state, the slide stop area 210 may resist the continued force applied in the first direction, and prevent the second housing 300 from further moving in the first direction and remain at the moved position.

In an embodiment, each of the connection guides may include a connection portion extended along the sliding direction (443, 543 or 643), a first portion (441, 541 or 641) and a second portion (442, 542 or 642) respectively extended in opposite directions along the direction crossing the sliding direction from opposing ends of the connection portion, the first and second portions spaced apart from each other along the sliding direction (e.g., the x-axis direction), a first seating portion (545) and a second seating portion (545) respectively extended in opposite directions along the sliding direction from the first portion and the second portion; and the clastic members (550) respectively engaged with the first seating portion and the second seating portion. Here, the sliding guides may further include each of the first fixed guide (430a, 530a or 630a) and the second fixed guide (430b, 530b or 630b) including a seating portion which is extended along the sliding direction, the seating portion of the first fixed guide facing the second seating portion of a connection (440, 540 or 640) guide closest to the first fixed guide along the sliding direction among all the sliding guides, the seating portion of the second fixed guide facing the first seating portion of a connection guide (440, 540 or 640) closest to the second fixed guide along the sliding direction among all the sliding guides, and among two connection guides adjacent to each other along the sliding direction, the first seating portion of a first connection guide faces the second seating portion of a second connection guide.

In an embodiment, each of the connection guides may include two connection portions (543) respectively extending from opposing ends of a same one of the second portion (542), two first portions (541) respectively extending from ends of the two connection portions, the two first portions spaced apart from each other along the direction crossing the sliding direction, two first seating portions respectively extended from the two first portions along the sliding direction, and two second seating portions each extended from the same one of the second portion, along the sliding direction, and in an opposite direction to that of the two first seating portions. The first fixed guide (530a) slidably engaged with a first groove adjacent to a center of the first plate along the direction crossing the sliding direction, the first fixed guide including two seating portions which are extended along the sliding direction and elastic members of the first fixed guide which are respectively engaged with the seating portions of the first fixed guide, two second fixed guides (530b) respectively slidably engaged with outermost first grooves among the first grooves along the direction crossing the sliding direction, the two second fixed guides respectively including seating portions which are extended along the sliding direction and elastic members which are respectively engaged with the seating portions of the two second fixed guides, and a length of the same one of the second portion along the direction crossing the sliding direction is equal to an overall length of a sliding guide adjacent to the same one of the second portion in a direction opposite to the first direction.

In an embodiment, each of the connection guides may include two connection portions (643) respectively extending from opposing ends of a same one of the second portion (642), one first portion (641) extending from an end of one of the two connection portions, a first seating portion extended from the one first portion along the sliding direction, and a second seating portions extended from the same one of the second portion, along the sliding direction, and in an opposite direction to that of the first seating portion. The first fixed guide (630a) may be slidably engaged with a first groove adjacent to a center of the first plate along the direction crossing the sliding direction, the first fixed guide including a seating portion which is extended along the sliding direction and the elastic member of the first fixed guide which is engaged with the seating portion of the first fixed guide. Two second fixed guides (630b) may be slidably engaged with outermost first grooves along the direction crossing the sliding direction, the two second fixed guides respectively including seating portions which are extended along the sliding direction and elastic members which are respectively engaged with the seating portions of the two second fixed guides, and a length of the same one of the second portion along the direction crossing the sliding direction is equal to an overall length of a sliding guide adjacent to the same one of the second portion in a direction opposite to the first direction.

The electronic device according to an embodiment of the disclosure may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that an embodiment of the disclosure and the terms used therein are not intended to limit the technological features set forth herein to particular embodiments and the disclosure includes various changes, equivalents, or alternatives for a corresponding embodiment. With regard to the description of the drawings, similar reference numerals may be used to designate similar or relevant elements.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It is to be understood that a singular form of a noun corresponding to an item may include one or more of the items, unless the relevant context clearly indicates otherwise. Within the Figures and the text of the disclosure, a reference number indicating a singular form of an element may also be used to reference a plurality of the singular element. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Such terms as "a first," "a second," "the first," and "the second" may be used to simply distinguish a corresponding element from another, and does not limit the elements in other aspect (e.g., importance or order).

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

If an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via a third element.

As used in an embodiment of the disclosure, the term "module" may include a unit implemented in hardware, software, or firmware, and may be interchangeably used with other terms, for example, "logic," "logic block," "component," or "circuit". The "module" may be a single integrated component, or a minimum unit or part thereof, adapted to perform one or more functions. For example, according to an embodiment, the "module" may be implemented in the form of an application-specific integrated circuit (ASIC).

An embodiment of the disclosure may be implemented as software (e.g., the program 1401) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions each may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, the method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities, and some of the multiple entities may also be separately disposed in another element. According to an embodiment, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration.

According to various embodiments, operations performed by the module, the program, or another element may be carried out sequentially, in parallel, repeatedly, or heuristically, or one or more of the operations may be executed in a different order or omitted, or one or more other operations may be added.

What is claimed is:

1. An electronic device comprising:

a first housing;

a second housing slidably coupled to the first housing;

a display fixed to the second housing and slidable together with the second housing, the display including an externally visible display area having a variable size by sliding of the second housing relative to the first housing along a sliding direction; and a sliding assembly connected to the first housing and to the second housing, the sliding assembly slidable together with the second housing relative to the first housing, wherein the sliding assembly comprises:

a first plate at which the sliding assembly is connected to the first housing, the first plate comprising first grooves defined therein, the first grooves extending along the sliding direction and arranged spaced apart from each other in a direction crossing the sliding direction;

a second plate facing the first plate along a thickness direction of the electronic device, the second plate comprising second grooves defined therein which respectively face the first grooves of the first plate;

sliding guides slidable relative to each other and together with each other between the first plate and the second plate together with the sliding of the second housing relative to the first housing, the sliding guides respectively slidably engaged with a pair of grooves including a first groove among the first grooves and a second groove which faces the first groove among the second grooves; and each sliding guide among the sliding guides including an elastic member which provides an elastic force to the sliding guide along the sliding direction, and wherein at least one of the sliding guides is connected to the first housing and at least one of the sliding guides is connected to the second housing.

2. The electronic device of claim 1, wherein each of the sliding guides comprises:

a first protrusion engaged with the first groove of the pair of grooves;

a second protrusion engaged with the second groove of the pair of grooves;

a side surface which faces an adjacent side surface of an adjacent sliding guide among the sliding guides along the direction crossing the sliding direction, each of the side surface and the adjacent side surface having a sliding structure; and the sliding structure including a groove or a protrusion, wherein the each of the sliding guides is slidably connected to the first plate and the second plate via the first protrusion and the second protrusion, respectively, and wherein the each of the sliding guides is slidably connected to the adjacent sliding guide via the sliding structures of the side surface and the adjacent side surface being slidably engaged with each other.

3. The electronic device of claim 1, wherein the sliding assembly further comprises:

a coupling member extending in the direction crossing the sliding direction, connected to the second housing at a coupling area of the coupling member and movable together with the second housing relative to the first housing; and the sliding guides being connected to the coupling member at the at least one of the sliding guides which is connected to the second housing.

4. The electronic device of claim 3, wherein the coupling area of the coupling member is provided at an end of the coupling member along the direction crossing the sliding direction, and the first plate and the second plate are both coupled to the coupling member at the coupling area thereof.

5. The electronic device of claim 1, further comprising a fixing member which fixes the second housing in a position closest to the first housing.

6. The electronic device of claim 1, further comprising:

a slide stop connected to the first housing; and a fixing member comprising a fixing groove, wherein the second housing slid a distance away from the first housing along the sliding direction is in a moved position relative to the first housing, and wherein engagement of the slide stop with the fixing groove of the fixing member fixes the second housing at the moved position relative to the first housing and restricts further sliding of the second housing along the sliding direction.

7. The electronic device of claim 1, wherein the sliding guides comprise:

a first fixed guide at which the sliding guides are fixedly coupled to the first housing, the first fixed guide at a fixed position on the first plate of the sliding assembly;

a second fixed guide at which the sliding guides are coupled to the second housing and slidable together therewith along the sliding direction relative to the first housing; and connection guides arranged between the first fixed guide and the second fixed guide along the sliding direction.

8. The electronic device of claim 7, wherein each of the connection guides comprises:

the elastic member provided in plural including elastic members;

a connection portion extended along the sliding direction;

a first portion and a second portion respectively extended in opposite directions along the direction crossing the sliding direction from opposing ends of the connection portion, the first and second portions spaced apart from each other along the sliding direction;

a first seating portion and a second seating portion respectively extended in opposite directions along the sliding direction from the first portion and the second portion; and the elastic members respectively engaged with the first seating portion and the second seating portion.

9. The electronic device of claim 8, the sliding guides further comprise:

each of the first fixed guide and the second fixed guide comprising a seating portion which is extended along the sliding direction, the seating portion of the first fixed guide facing the second seating portion of a connection guide closest to the first fixed guide along the sliding direction among all the sliding guides, the seating portion of the second fixed guide facing the first seating portion of a connection guide closest to the second fixed guide along the sliding direction among all the sliding guides, and among two connection guides adjacent to each other along the sliding direction, the first seating portion of a first connection guide faces the second seating portion of a second connection guide.

10. The electronic device of claim 9, wherein the sliding guides further comprise:

the first fixed guide, the connection guides and the second fixed guide in order in a first direction along the sliding direction, the elastic member of the first fixed guide commonly engaged with the seating portion of the first fixed guide and the seating portion of a connection guide adjacent to the first fixed guide in the first direction, and the elastic member of the second fixed guide commonly engaged with the seating portion of the second fixed guide and the seating member of a connection guide adjacent to the second fixed guide in a direction opposite to the first direction.

11. The electronic device of claim 1, wherein lengths of the first grooves along the sliding direction consecutively increase from one side of the first plate to an opposite side of the first plate along a direction crossing the sliding direction.

12. The electronic device of claim 9, wherein each of the seating portions of the first and second fixed guides, the first seating portion and the second seating portion has a cylindrical shape extending along the sliding direction.

13. The electronic device of claim 8, wherein each of the connection guides further comprise the first portion and the second portion including a sliding structure facing an adjacent sliding structure of an adjacent connection guide among the connection guides, and wherein the connection guides are slidably connected to each other via slidable coupling of the sliding structure and the adjacent sliding structure.

14. The electronic device of claim 8, wherein the sliding guides further comprise:

the first fixed guide, the connection guides and the second fixed guide in order in a first direction along the sliding direction, each of the connection guides further comprising:

two connection portions respectively extending from opposing ends of a same one of the second portion;

two first portions respectively extending from ends of the two connection portions, the two first portions spaced apart from each other along the direction crossing the sliding direction;

two first seating portions respectively extended from the two first portions along the sliding direction; and two second seating portions each extended from the same one of the second portion, along the sliding direction, and in an opposite direction to that of the two first seating portions, the first fixed guide slidably engaged with a first groove adjacent to a center of the first plate along the direction crossing the sliding direction, the first fixed guide comprising two seating portions which are extended along the sliding direction and elastic members of the first fixed guide which are respectively engaged with the seating portions of the first fixed guide, two second fixed guides respectively slidably engaged with outermost first grooves among the first grooves along the direction crossing the sliding direction, the two second fixed guides respectively comprising seating portions which are extended along the sliding direction and elastic members which are respectively engaged with the seating portions of the two second fixed guides, and a length of the same one of the second portion along the direction crossing the sliding direction is equal to an overall length of a sliding guide adjacent to the same one of the second portion in a direction opposite to the first direction.

15. The electronic device of claim 14, wherein the sliding guides further comprise:

the seating portions of the first fixed guide facing the same one second seating portion of a connection guide closest to the first fixed guide along the sliding direction among all the sliding guide, the seating portions of the second fixed guides respectively facing the first seating portions of a connection guide closest to the second fixed guides along the sliding direction among all the sliding guides, and among two connection guides adjacent to each other along the sliding direction, the first seating portions of a first connection guide respectively face the second seating portions of a second connection guide.

16. The electronic device of claim 8, wherein the sliding guides further comprise:

the first fixed guide, the connection guides and the second fixed guide in order in a first direction along the sliding direction, each of the connection guides further comprising:

two connection portions respectively extending from opposing ends of a same one of the second portion;

one first portion extending from an end of one of the two connection portions;

a first seating portion extended from the one first portion along the sliding direction; and a second seating portions extended from the same one of the second portion, along the sliding direction, and in an opposite direction to that of the first seating portion, the first fixed guide slidably engaged with a first groove adjacent to a center of the first plate along the direction crossing the sliding direction, the first fixed guide comprising a seating portion which is extended along the sliding direction and the elastic member of the first fixed guide which is engaged with the seating portion of the first fixed guide, two second fixed guides slidably engaged with outermost first grooves along the direction crossing the sliding direction, the two second fixed guides respectively comprising seating portions which are extended along the sliding direction and elastic members which are respectively engaged with the seating portions of the two second fixed guides, and a length of the same one of the second portion along the direction crossing the sliding direction is equal to an overall length of a sliding guide adjacent to the same one of the second portion in a direction opposite to the first direction.

17. The electronic device of claim 16, wherein the sliding guides further comprise:

the seating portion of the first fixed guide facing the second seating portion of a connection guide closest to the first fixed guide along the sliding direction among all the sliding guides, the seating portion of the second fixed guide facing the first seating portion of a connection guide closest to the second fixed guide along the sliding direction among all the sliding guides, and among two connection guides adjacent to each other along the sliding direction, the first seating portion of a first connection guide faces the second seating portion of a second connection guide.

18. The electronic device of claim 16 wherein each of the connection guides further comprises the first portion and the second portion including a sliding structure facing an adjacent connection guide among the connection guides, and wherein the connection guides are slidably connected to each other via slidable coupling of facing sliding structures with each other.

19. The electronic device of claim 8, wherein the second housing at a minimum distance away from the first housing along the sliding direction includes the sliding guides nested with each other and the first fixing guide aligned with the second fixing guide along the direction crossing the sliding direction.

20. The electronic device of claim 8, wherein the second housing slid a distance away from the first housing along the sliding direction includes the sliding guides staggered with each other along the sliding direction and along the direction crossing the sliding direction.

\* \* \* \* \*